United States Patent [19]

Kato

[11] Patent Number: 5,323,355

[45] Date of Patent: Jun. 21, 1994

[54] SEMICONDUCTOR MEMORY DEVICE

[75] Inventor: Yoshiharu Kato, Kasugai, Japan

[73] Assignee: Fujitsu Limited, Kawasaki, Japan

[21] Appl. No.: 923,998

[22] PCT Filed: Jan. 22, 1992

[86] PCT No.: PCT/JP92/00048

§ 371 Date: Sep. 22, 1992

§ 102(e) Date: Sep. 22, 1992

[87] PCT Pub. No.: WO92/13348

PCT Pub. Date: Aug. 6, 1992

[30] Foreign Application Priority Data

Jan. 22, 1991 [JP] Japan .................................. 3-5733

[51] Int. Cl.$^5$ .............................................. G11C 7/00
[52] U.S. Cl. ........................... 365/230.01; 365/230.04;
365/230.08
[58] Field of Search ...................... 365/230.01, 230.04,
365/230.09, 189.11, 189.05, 230.08

[56] References Cited

U.S. PATENT DOCUMENTS

| | | | |
|---|---|---|---|
| 4,807,192 | 2/1989 | Nakano et al. | 365/193 |
| 4,876,671 | 6/1989 | Norwood et al. | 365/189.11 |
| 4,899,312 | 2/1990 | Sato | 365/230.09 |
| 5,105,389 | 4/1992 | Matsuo et al. | 365/230.01 |

FOREIGN PATENT DOCUMENTS

| | | |
|---|---|---|
| 60-157798 | 8/1985 | Japan . |
| 61-170994 | 8/1986 | Japan . |
| 62-188093 | 8/1987 | Japan . |
| 63-52397 | 5/1988 | Japan . |
| 2-143983 | 6/1990 | Japan . |
| 3-113795 | 6/1991 | Japan . |

Primary Examiner—Eugene R. LaRoche
Assistant Examiner—Tan Nguyen

[57] ABSTRACT

A semiconductor memory device according to the invention includes a memory cell array (8) connected to a data bus through a first selector circuit (6), a second selector circuit (7) responsive to a first control signal ($\phi$ 0, $\phi$ X), a third selector circuit (8) responsive to a second control signal ($\phi$ 1 to $\phi$ 8), a row address buffer (17) responsive to activation of a row address strobe signal, an address fetching circuit (21) for instructing fetching of a column address every time of a specified number of toggled CAS signals, a column address buffer (19) responsive to a third control signal from the address fetching circuit (21), a nibble decoder (38) for generating the first and the second control signals, and a gate control circuit (39). A column address used to access a next memory cell is fetched during an activating period of the row address strobe signal after the column address is fetched.

2 Claims, 21 Drawing Sheets $\phi_{A1}$ : Activating Signal of Amplifier

Fig. 21

| Item | Symbol | | | |
|---|---|---|---|---|
| Random Read/Write Cycle Time | $t_{RC}$ | Min | 155~210 | ns |
| Access Time from $\overline{RAS}$ | $t_{RAC}$ | Max | 80~120 | ns |
| Access Time from $\overline{CAS}$ | $t_{CAC}$ | Max | 25~35 | ns |
| Column Address Access Time | $t_{AA}$ | Max | 45~60 | ns |
| Pulse Width of $\overline{RAS}$ | $t_{RAS}$ | Min | 80~120 | ns |
| | | Max | $10^5$ | ns |
| Delay Time of $\overline{RAS}$, $\overline{CAS}$ | $t_{RCD}$ | Min | 22~25 | ns |
| | | Max | 55~85 | ns |
| Pulse Width of $\overline{CAS}$ | $t_{CAS}$ | Min | 25~35 | ns |
| Column Address Hold Time | $t_{CAH}$ | Min | 15~20 | ns |
| Nibble Mode Read/Write Cycle | $t_{NC}$ | Min | 50~60 | ns |
| Nibble mode $\overline{CAS}$ Precharge Time | $t_{NCP}$ | Min | 15 | ns |

_5,323,355_

SEMICONDUCTOR MEMORY DEVICE

TECHNICAL FIELD

The present invention relates to a semiconductor memory device such as a dynamic RAM and, more particularly to a dynamic RAM capable of reading different data sequentially by changing an initial address in the same read cycle and of increasing a reading speed in a nibble mode.

TECHNICAL BACKGROUND

Dynamic RAMs (hereinafter referred to as DRAMs) have been recently required to be usable in a flexible manner in a variety of modes. There are nibble mode type of DRAMs that are available which are designed to simultaneously read data consisting of a plurality of bits of data to a plurality of pairs of bus lines, and to output the data read out to the respective pairs of bus lines one by one in order to increase a data reading speed. There are proposed a variety of extended nibble modes in the nibble mode type of DRAMs.

A DRAM of the conventional nibble mode type is shown in FIG. 14. A memory cell array 11 includes a plurality of memory cells. To the array 11 are connected a row decoder 12, a sense amplifier and input-/output (I/O) gate 13, and a column decoder 14. To the sense amplifier and I/O gate 13 is connected a gate circuit 15, to which is connected a data output buffer 16.

To the row decoder 12 is connected a row address buffer 17, which feeds to a row decoder 12 an external address signal AD including a plurality of bits input from an unillustrated controller unit.

A row controller 18 controls the row decoder 12 and the row address buffer 17 based on the levels of a row address strobe signal $\overline{RAS}$ and a column address strobe signal $\overline{CAS}$, both serving as address activating signals.

To the column decoder 14 is connected a column address buffer 19, which feeds to the column decoder 14 an external address signal AD including a plurality of bits input from the controller.

A column controller 20 controls the sense amplifier and I/O gate 13, the column decoder 14, and the column address buffer 19 based on the level of an output signal of an AND circuit 21 to which a control signal RASZ from the row controller 18 and the column address strobe signal $\overline{CAS}$ are input.

A clock generating circuit 22 including an odd number of inverter circuits receives the column address strobe signal $\overline{CAS}$, and outputs to a nibble counter 23 a clock signal CLK having a negative phase to the signal $\overline{CAS}$ as shown in FIG. 17. The nibble counter 23 counts the clock signal CLK input from the clock generating circuit 22, and outputs its counted result to a nibble decoder 24. The nibble decoder 24 decodes a counted value of the nibble counter 23, and outputs to a gate control circuit 25 control signals φA to φD shown in FIG. 17.

The gate control circuit 25 takes an AND (logical product) of the control signals φA to φD from the nibble decoder 24 and the clock signal CLK from the clock generating circuit 22, and outputs control signals φ11 to φ14 shown in FIG. 17 to the gate circuit 15 so as to control the gate circuit 15.

A data input buffer 26 is connected to the sense amplifier and I/O gate 13, and receives a write data Din based on a control signal from an unillustrated write clock generator.

FIGS. 15 and 16 show in detail the memory cell array 11, the sense amplifier and I/O gate 13, the gate circuit 15, and the data output buffer 16. As shown in FIG. 15, a data bus 30 includes four pairs of data bus lines DB0, $\overline{DB0}$ to DB3, $\overline{DB3}$, to which pairs of bit lines BL0, $\overline{BL0}$ to BL3, $\overline{BL3}$ are connected, respectively. The pairs of bit lines BL0, $\overline{BL0}$ to BL3, $\overline{BL3}$ are connected to memory cells 32 each having one end thereof connected to a word line WL through gate transistors T1 and a sense amplifier 31.

On the respective pairs of data bus lines DB0, $\overline{DB0}$ to DB3, $\overline{DB3}$ are arranged amplifiers 33. Gate circuits 15 each including nMOS transistors T2, T3 are provided at the output sides of each amplifier 33 as shown in FIG. 16. The control signal φ11 is input to gates of the nMOS transistors T2, T3 arranged on the pair of bus lines DB0, $\overline{DB0}$. The control signal φ12 is input to gates of the nMOS transistors T2, T3 arranged on the pair of bus lines DB1, $\overline{DB1}$. The control signal φ13 is input to gates of the nMOS transistors T2, T3 arranged on the pair of bus lines DB2, $\overline{DB2}$. The control signal φ14 is input to gates of the nMOS transistors T2, T3 arranged on the pair of bus lines DB3, $\overline{DB3}$.

Each of the data bus lines DB0 to DB3 are connected to a common inverter circuit 34 after the transistors T2, while the data bus lines $\overline{DB0}$ to $\overline{DB3}$ are connected to a common inverter circuit 35 after the transistors T3. The data output buffer 16 includes nMOS transistors T4, T5 connected in series between a power supply VCC and a ground GND. The inverter circuit 34 is connected to a gate terminal of the transistor T4 while the inverter circuit 35 is connected to a gate terminal of the transistor T5. The data output buffer 16 outputs an output signal Dout in the form of a logic value "1" or "0" in accordance with output signals of the inverter circuits 34, 35.

In the DRAM thus constructed, a read cycle is started if the column address strobe signal CAS is in the high level (H-level) when the row address strobe signal $\overline{RAS}$ is switched to a low level (L-level) as shown in FIG. 17. After either one of the word lines WL is selected in accordance with a row address ADR of the address signal AD, a column address ADC is fed and a column selection signal CL0 turns to H-level. Thereupon, data written in the specified memory cells 32 on the respective pairs of bit lines BL0, $\overline{BL0}$ to BL3, $\overline{BL3}$ are, via each gate transistor T1 output to the corresponding pairs of data bus lines DB0, $\overline{DB0}$ to DB3, $\overline{DB3}$, and each data is amplified by the amplifiers 33 respectively.

Then, the control signals φ11 to φ14 are generated by the gate control circuit 23 based on the clock signal CLK from the clock generating circuit 22 and the control signals φA to φD from the nibble decoder 24. Upon receipt of the control signals φ11 to φ14, the transistors T2, T3 arranged on the pairs of data bus lines DB0, $\overline{DB0}$ to $\overline{DB3}$ are turned on, and thereby the data read out through the data bus lines DB0, $\overline{BD0}$ to DB3, $\overline{DB3}$ are output through the data output buffer 16 sequentially.

However, in the prior art DRAM, as shown in FIG. 17, the column address ADC of the address signal latched at leading edges of the row address strobe signal $\overline{RAS}$ and the column address strobe signal $\overline{CAS}$ is set as an initial address of the nibble counter 23 in the same cycle defined between a fall of the row address strobe signal $\overline{RAS}$ and a rise thereof. Further, the column selection signal CL0 is maintained in the H-level so as to read out the data to the pairs of data bus lines DB0, $\overline{DB0}$ to DB3, $\overline{DB3}$. Accordingly, when the addresses corresponding to the number of bits constituting the nibble counter 23 (normally, four bits) are changed from an initial address, the address returns to the initial address, with the result that the output signal Dout outputs again the same data repeatedly.

In order to prevent the same data from being repeatedly output, the read cycle is started by changing the row address strobe signal $\overline{RAS}$ to the L-level immediately after changing the same to the H-level at the time when the addresses corresponding to the number of bits constituting the nibble counter 23 (normally, four bits) are changed. However, according to this method, it takes time until the first data is output as shown in FIG. 17, thereby suffering the problem of being incapable of increasing a data reading speed.

DISCLOSURE OF THE INVENTION

The present invention is made to overcome the above problems, and an object thereof is to read different data sequentially by changing an initial address in the same read cycle and to increase a reading speed in a nibble mode type DRAM.

BRIEF DESCRIPTION OF THE DRAWINGS

FIG. 21 is a table showing an example of list of characteristics of a memory according to the invention;

BEST MODE FOR EMBODYING THE INVENTION

Figure 1:
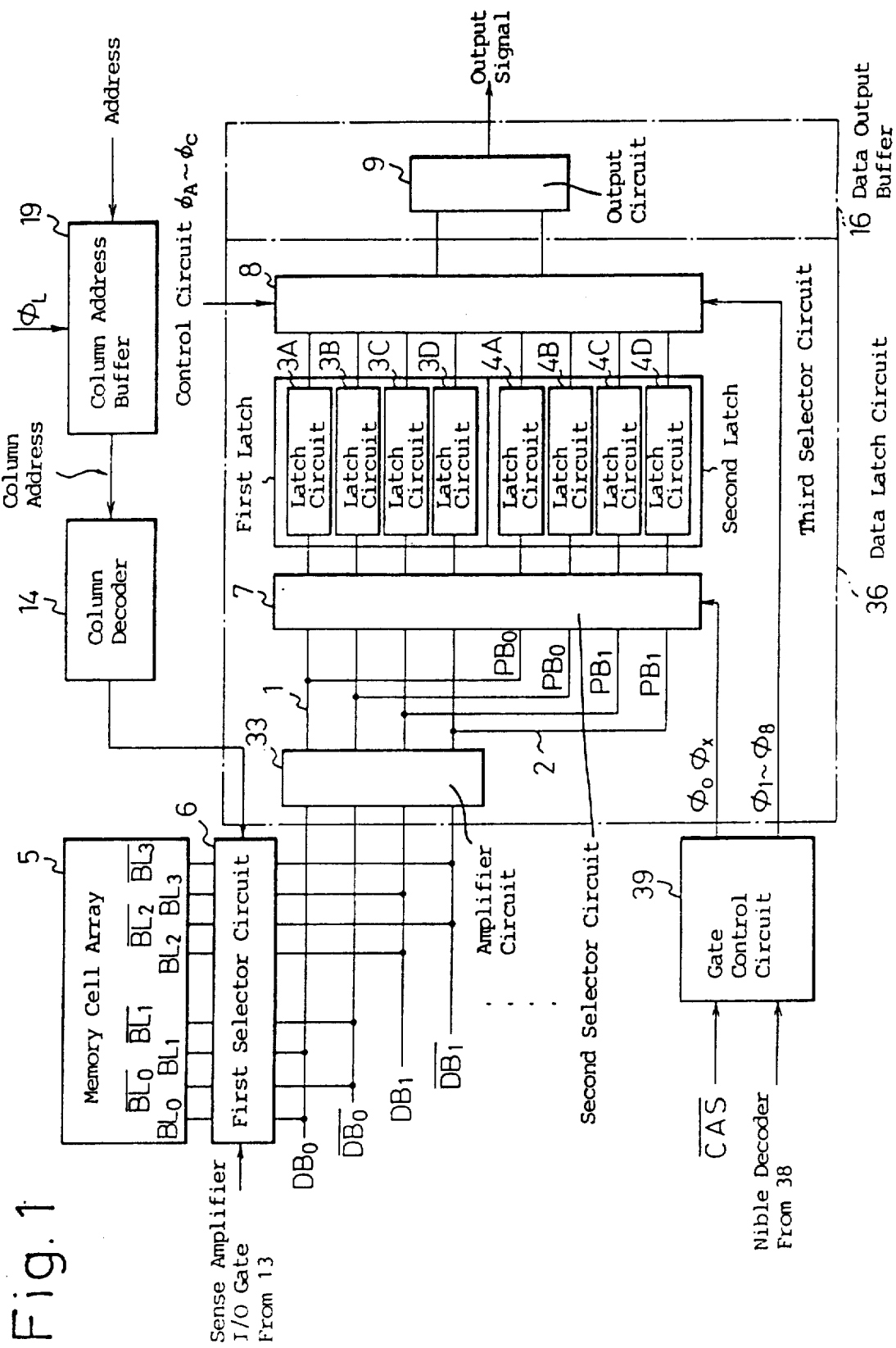
FIG. 1 is a block diagram explaining a principle of the invention.

FIG. 1 is a block diagram explaining a principle of the invention.

A data bus 1 includes a plurality of pairs of bus lines DB0, $\overline{DB0}$; and DB1, $\overline{DB1}$. A plurality of latch circuit 3A to 3D are arranged on the respective pairs of bus lines DB0, $\overline{DB0}$; and DB1, $\overline{DB1}$. A branch bus 2 includes pairs of bus lines PB0, $\overline{PB0}$; and PB1, $\overline{PB1}$ which are branched from the respective pairs of bus lines DB0, $\overline{DB0}$, DB1 and $\overline{DB1}$). A plurality of latch circuits 4A to 4D are arranged on the respective bus lines PB0, $\overline{PB0}$; and PB1, $\overline{PB1}$. A memory cell array 5 is provided with a plurality of mutually different pairs of bit lines BL0, $\overline{BL0}$ to BL3, $\overline{BL3}$ corresponding to the respective pairs of bus lines DB0, $\overline{DB0}$ and DB1, $\overline{DB1}$ of the data bus 1.

A first selector circuit 6 selects different bit line pairs from among a plurality of bit line pairs and connects the selected bit line pairs to the corresponding pairs of bus lines DB0, $\overline{DB0}$ and DB1, $\overline{DB1}$ each time the level of the column address signal is switched in a read cycle. The first selector circuit 6 outputs data stored in the memory cells to the respective pairs of bus lines DB0, $\overline{DB0}$ and DB1, $\overline{DB1}$ through the selected bit line pairs.

A second selector circuit 7 alternately selects either the data bus 1 or the branch bus 2 in synchronization with the selecting operation of the first selector circuit 6, and at that time causes to latch the respective data read through a plurality of bit line pairs selected by the first selector circuit 6 to the respective latch circuits arranged on the selected bus. A third selector circuit 8 alternately selects either the data bus or the branch bus in a sequence selected by the second selector circuit 7 based on a control signal input at a specified period, sequentially selects the respective latch circuits of the selected data bus or branch bus, and outputs the data latched by the selected latch circuits.

An output circuit 9 receives the data in a single latch circuit output through the third selector circuit 8 to output an output signal.

An operation of the device according to the invention will be described hereinafter.

The different pairs of bit lines are selectively switched and connected to the respective pairs of bus lines by the first selector circuit 6 based on the column address signal in a read cycle. The data stored in the memory cells are output to the respective pairs of bus lines DB0, $\overline{DB0}$ and DB1, $\overline{DB1}$ through the selected pairs of bit lines.

Subsequently, for example, the data bus 1 is selected by the second selector circuit 7 in synchronization with the selecting operation of the first selector circuit 6, and the data read through a plurality of pairs of bit lines selected by the first selector circuit 6 are latched to the respective latch circuits 3A to 3D of the data bus 1.

The data bus 1 selected by the second selector circuit 7 is selected by the third selector circuit 8 based on the control signal input at the specified period. The respective latch circuits 3A to 3D of the selected data bus 1 are sequentially selected, and the data latched by the selected latch circuit is output. This data is output as an output signal by the output circuit 9.

When the level of the column address signal is switched while the data latched by the respective latch circuits 3A to 3D are sequentially output through the third selector circuit 8, a plurality of pairs of bit lines which are different from those previously selected are selected and connected to the respective pairs of bus lines DB0, $\overline{DB0}$ and DB1, $\overline{DB1}$. The data stored in the memory cells are output to the respective pairs of bus lines DB0, $\overline{DB0}$ and DB1, $\overline{DB1}$ through the selected pairs of bit lines.

At this time, the branch bus 2 is selected by the second selector circuit 7, and the data read through a plurality of pairs of bit lines selected by the first selector circuit 6 are latched to the respective latch circuits 4A to 4D of the branch bus 2.

When all the latch circuits of the data bus 1 are selected by the third selector circuit 8, the branch bus 2 is selected next. Further, the respective latch circuits 4A to 4D arranged on the selected branch bus 2 are sequentially selected, and the data latched by the selected latch circuit is output.

Accordingly, since different data can be sequentially output by switching the level of the column address signal in the same read cycle, and the data latched by the latch circuits are output based on the control signal input at the specified period, a data reading speed can be increased.

An example of a DRAM embodying the invention will be described hereinafter with reference to FIGS. 2 to 13.

Figure 14:
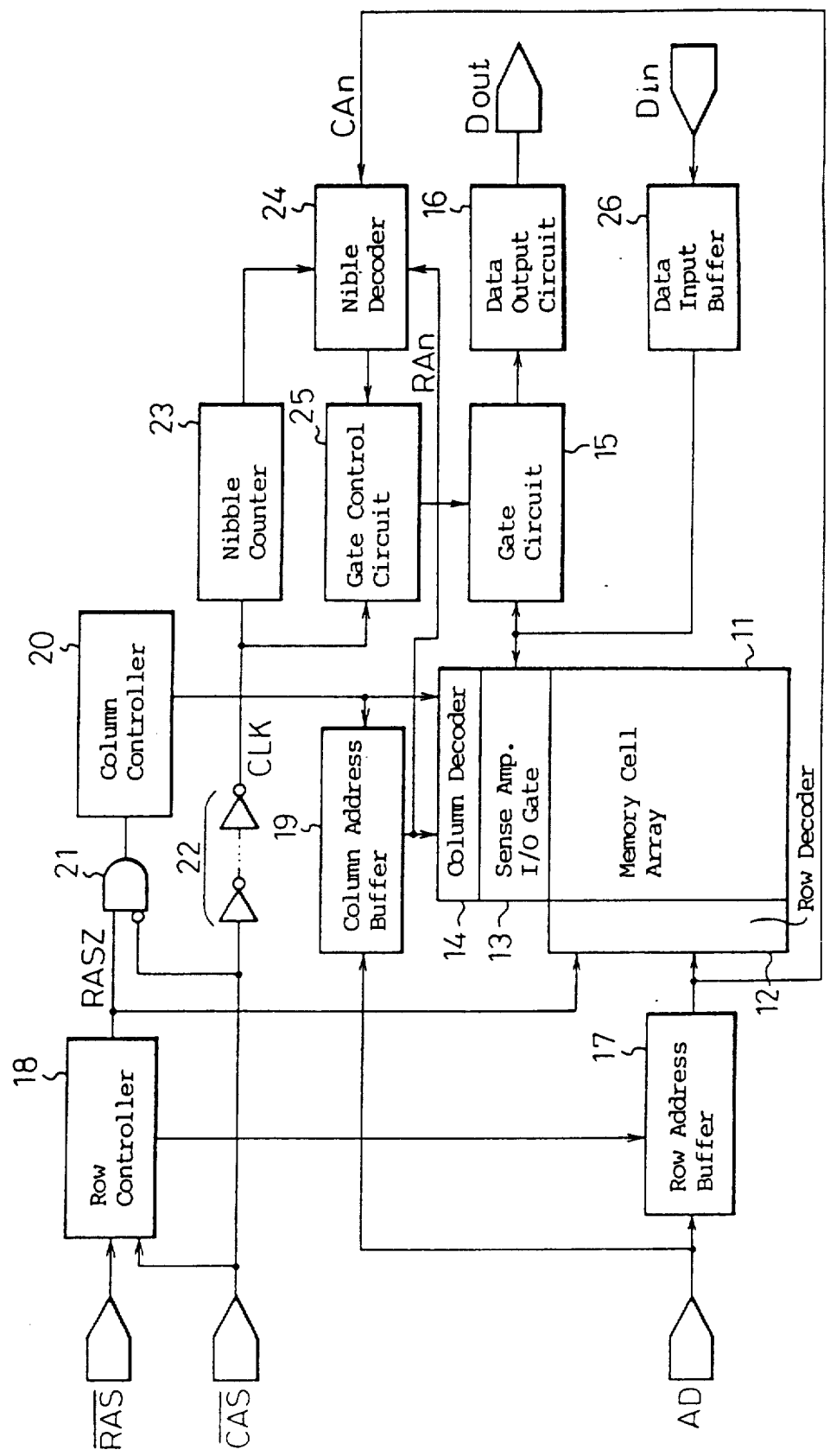
FIG. 14 is a schematic block diagram of a prior art DRAM.
Figure 15:
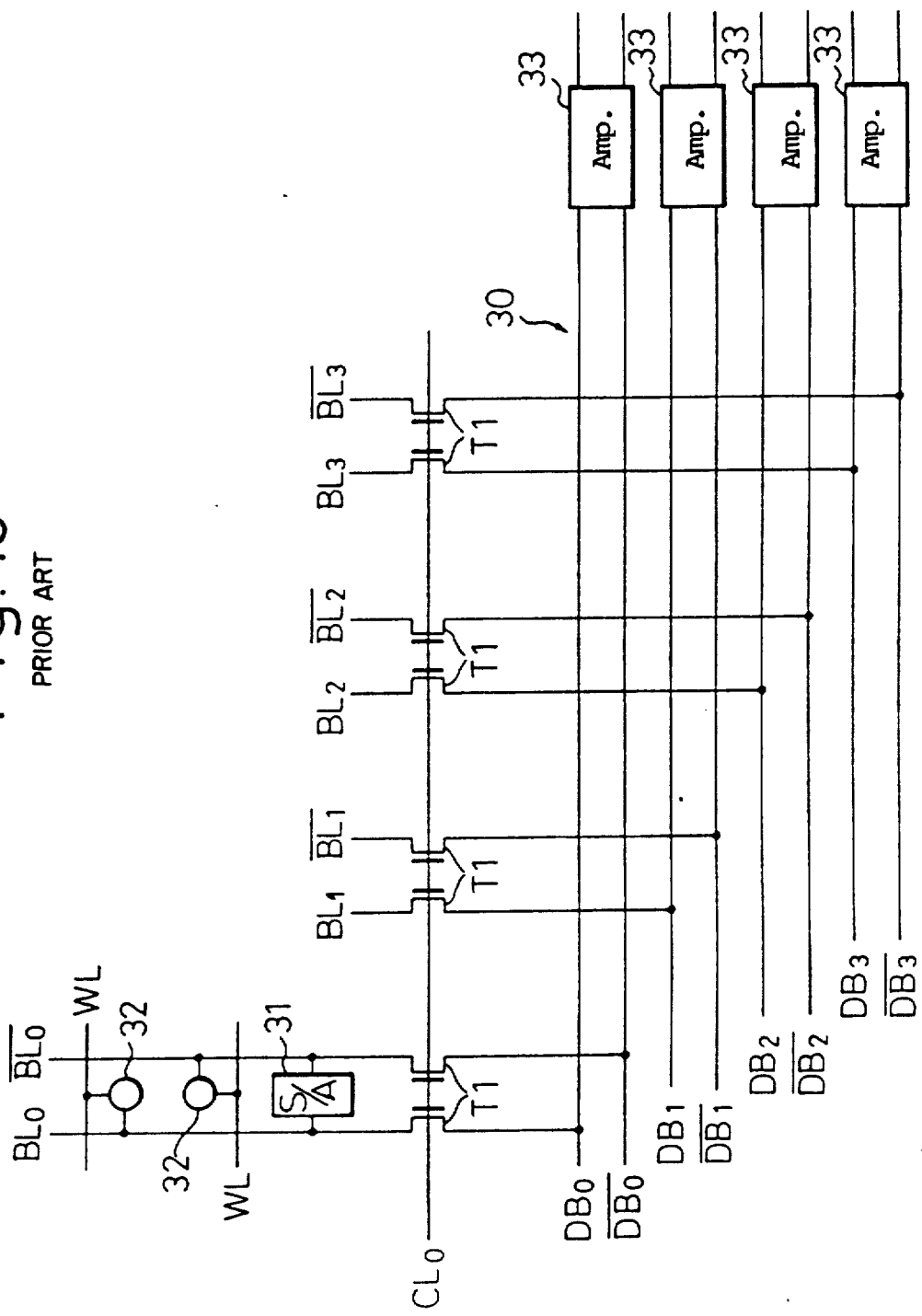
FIG. 15 is an electric circuit diagram showing a prior art data bus.
Figure 16:
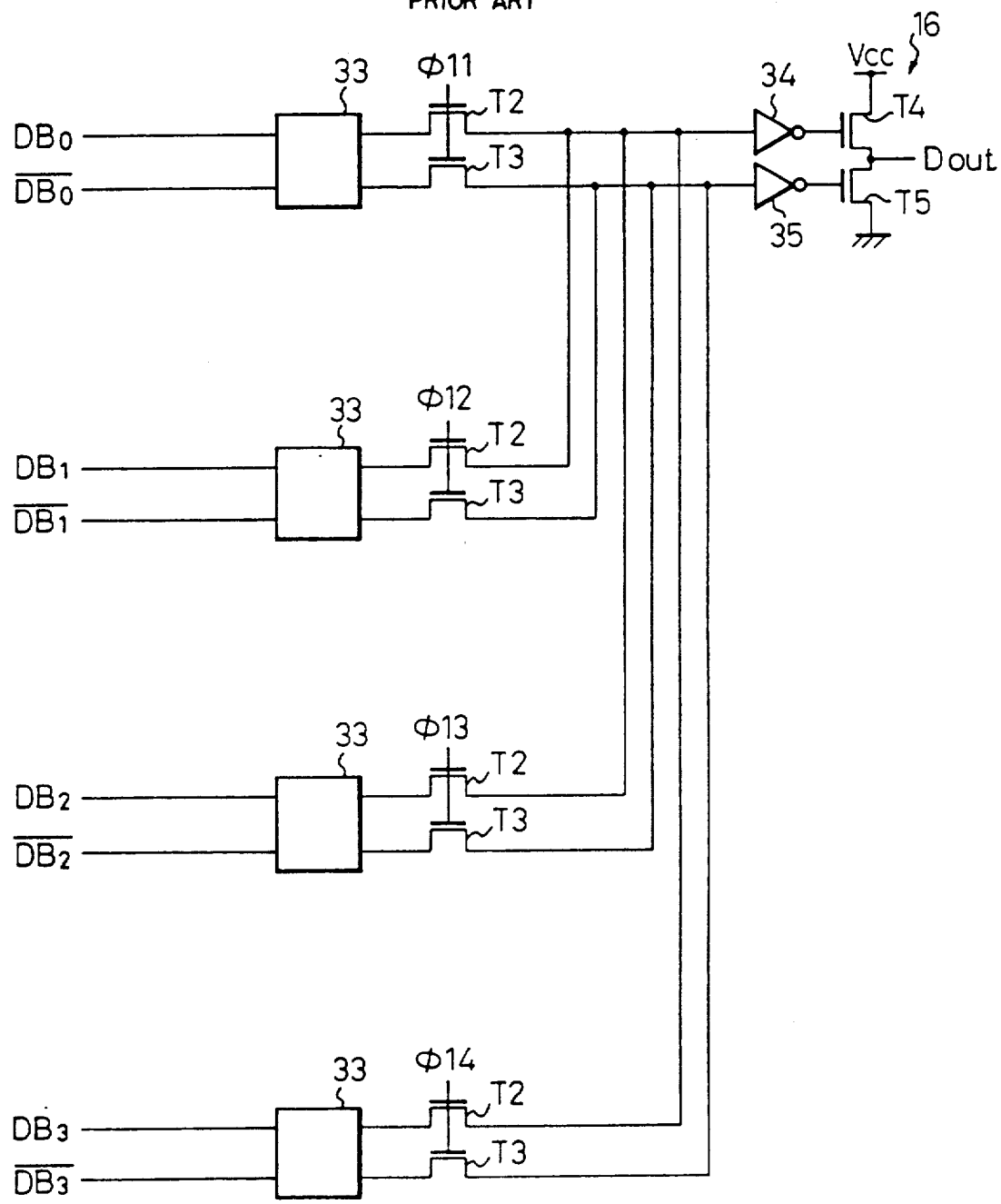
FIG. 16 is an electric circuit diagram showing a prior art gate circuit.
Figure 17:
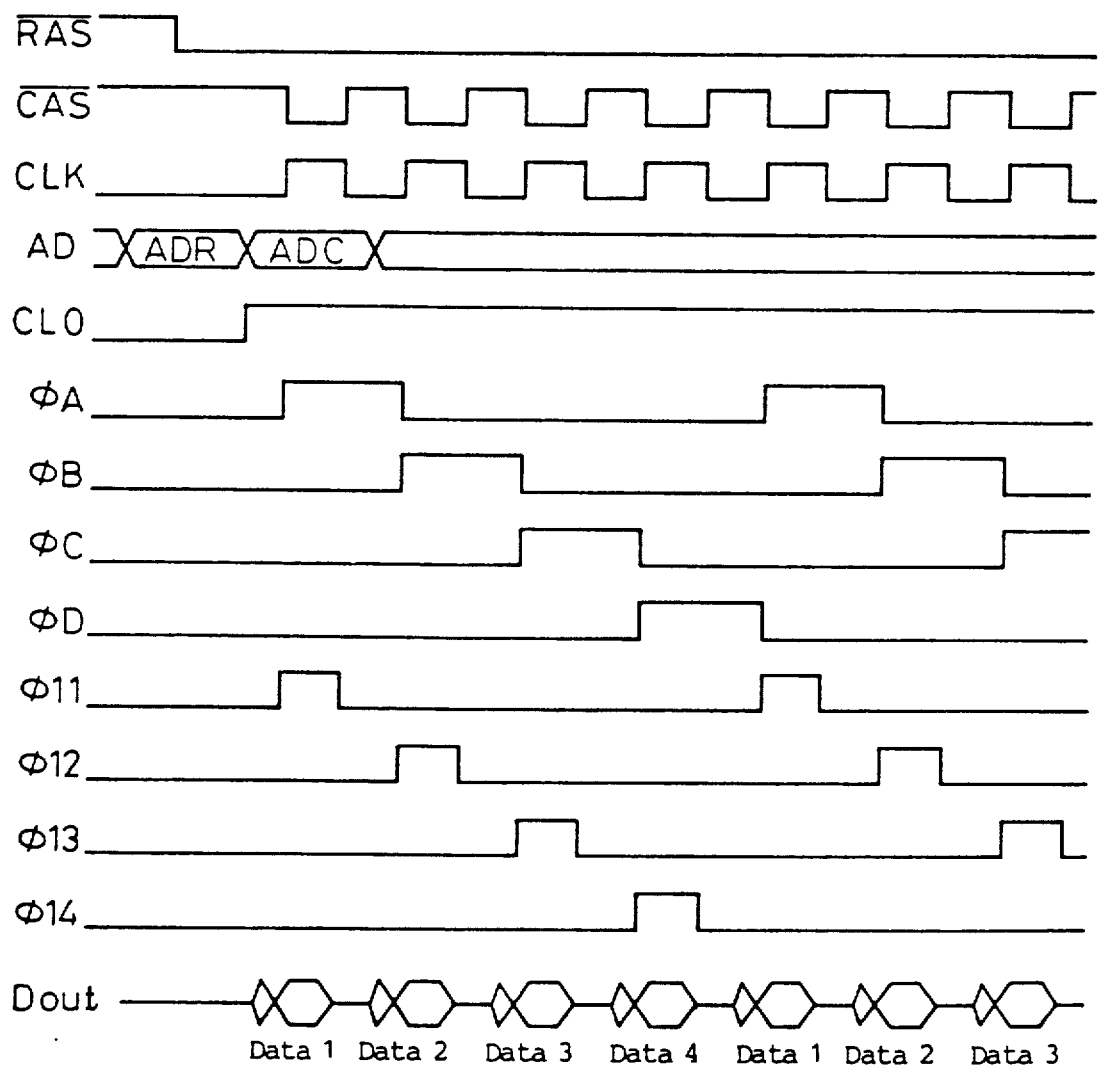
FIG. 17 is a timing chart showing a prior art operation.

It will be appreciated that description is partially omitted by affixing like reference numerals to components similar to those of the prior art shown in FIGS. 14 to 16 for the sake of convenience.

Figure 2:
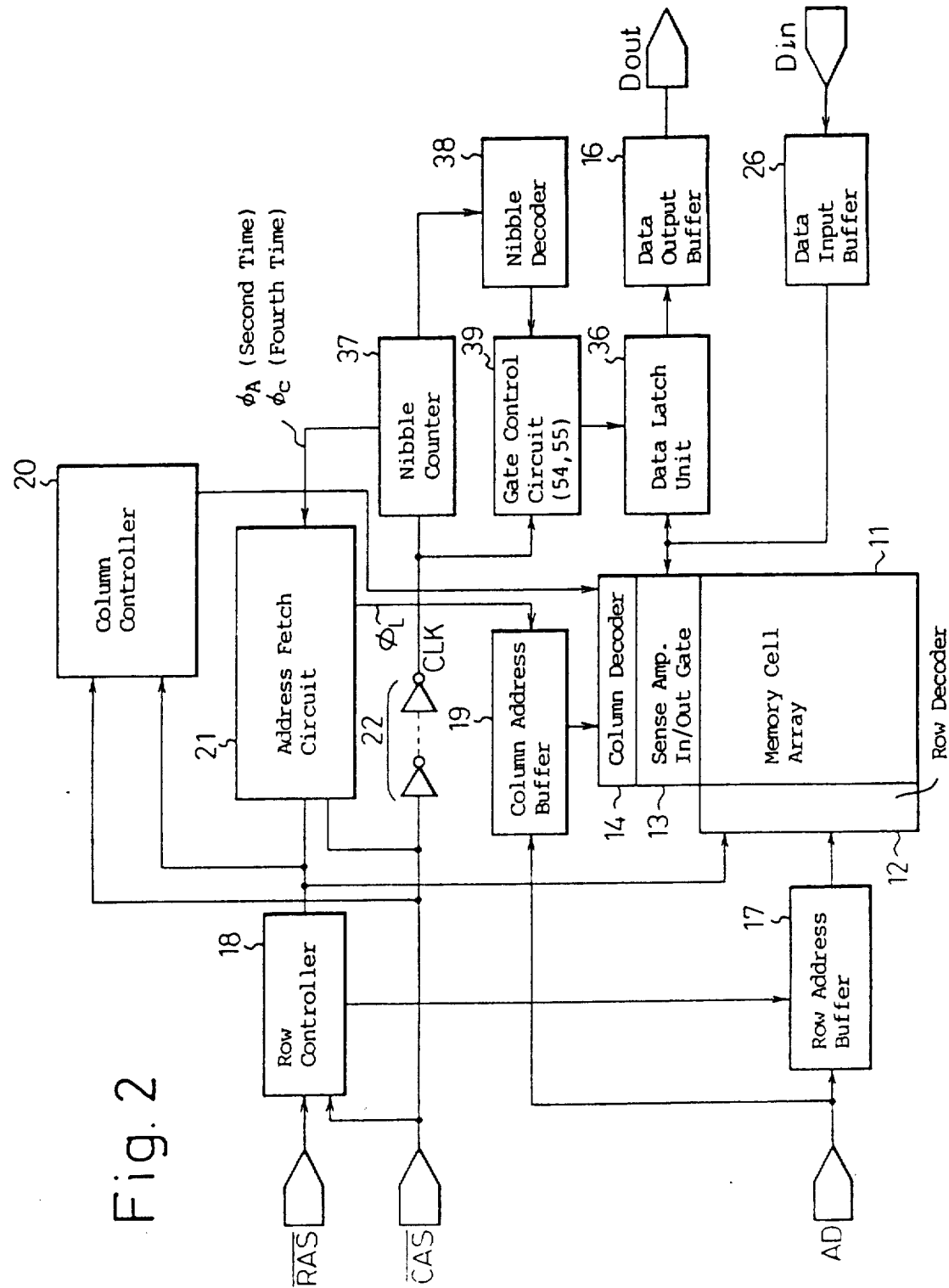
FIG. 2 is a schematic block diagram showing a dynamic RAM as a first embodiment.

As shown in FIG. 2, in the DRAM according to the invention, a sense amplifier and I/O gate 13 is connected to a data latch unit 36, which is in turn connected to said data output buffer 16. The data latch unit 36 is controlled by a gate control circuit 39, to which is connected a nibble decoder 38 for decoding a count result of a nibble counter 37.

A count output of the nibble counter 37 is sent together with a column address strobe signal $\overline{CAS}$ through an address fetching circuit 21 to a column controller 20, an output of which is sent to a column decoder 14.

A normal read operation, a normal write operation, and a read operation in a nibble mode will be described hereat, with reference to FIG. 2.

A. Normal Read Operation

1. The signal $\overline{RAS}$ is activated from H-level to L-level.

2. A row controller 18 outputs a control signal to fetch a row address to a row address buffer 17. Thereupon, the row address buffer 17 latches an address input to an address terminal thereof as a row address.

3. The row address is sent to a row decoder 12, which in turn selects one word line. The data stored in a memory cell connected to the selected word line is output to the respective pairs of bit lines for one word, and is amplified by the sense amplifier 13.

4. The signal $\overline{CAS}$ is activated from H-level to L-level after the operation 2.

5. The column controller 20 outputs the control signal to fetch the column address to the column address buffer 19. The column address buffer 19 in turn latches the address input to an address terminal thereof as a column address.

6. The column address is sent to the column decoder 14, which in turn selects four gate transistors (I/O gate 13).

7. The four gate transistors selected by the column decoder 14 output the data to the four pairs of data buses. The output data are then amplified by the amplifier, are latched by the data latch unit 36, and are output through four data output buffers 16.

B. Normal Write Operation

1. The same operations as those of 1 to 3 of said normal read operation are executed.

2. A write enable signal (WE) is activated from H-level to L-level, thereby making the data output buffer 16 inactive.

3. The same operations as those of 4 to 5 of said normal read operation are executed.

4. At the same time when the operation of 5 of said normal read operation is executed, the column controller 20 feeds the control signal to fetch the data to the data input buffer 26, which in turn latches the data input to a data terminal thereof.

5. The latched data is amplified by an unillustrated write amplifier, and is written in four memory cells selected by the row address and the column address through the pairs of bit lines.

C. Read Operation in a Nibble Mode

1. The same operations as those of 1 to 5 of the normal read operation are executed.

2. At the same time when the operation of 5 of the normal read operation is executed, the most significant bits of the row address and the column address are set as a nibble address in the nibble decoder 38.

3. The nibble counter 37 counts up each time an edge where the signal $\overline{CAS}$ changes from H-level to L-level is detected. In response to a count-up of the nibble counter 37, the nibble decoder 38 increments the set nibble address (the nibble address is returned to the original one upon fourth increment, and thereby a toggle operation is started).

4. The same operation as that of 6 of said normal read operation is executed.

5. The four gate transistors selected by the column decoder 14 deliver the data to the four pairs of data buses. The data is amplified by the amplifier, and is latched by a first data latch unit in response to an output of a gate control circuit 39 for generating a control signal to control the gates upon receipt of the signal from the nibble decoder 38.

6. Upon detecting the second edge where the signal $\overline{CAS}$ changes from H-level to L-level, the address fetching circuit 21 executes the same operations as those of 5 to 6 of said normal read operation. The four gate transistors selected by the column decoder 14 deliver data to the four pairs of data buses, the data is then amplified by the amplifier and is latched in a second data latch unit in response to the output of the gate control circuit 39.

7. Hereafter, the data latched in the first and the second data latch units are controlled by the control signal in the gate control circuit 39, and are output through the data output buffer 16 bit by bit as disclosed in the present specification.

Figure 18:
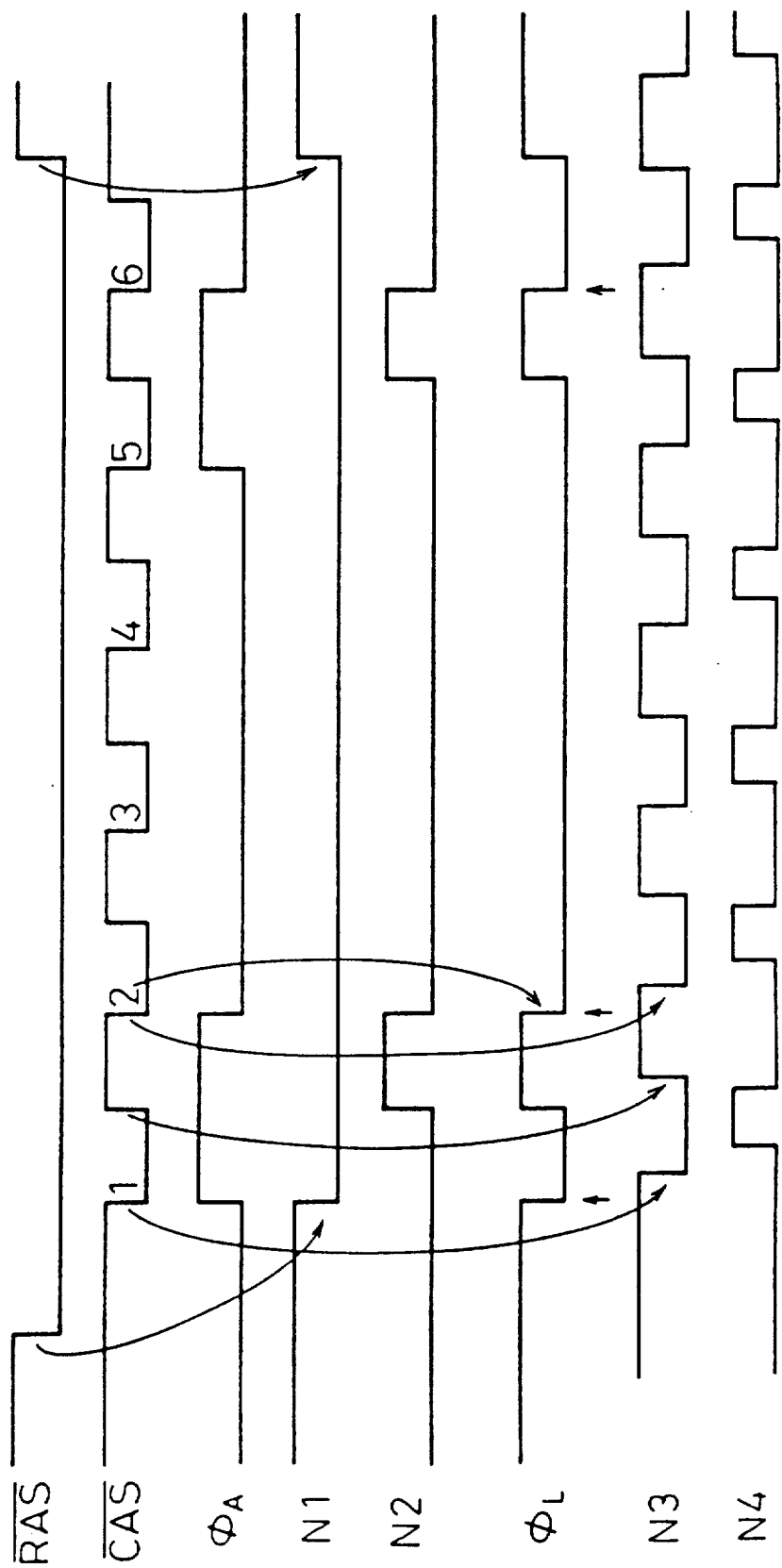
FIG. 18 is a timing chart showing a relationship between a signal used to fetch a column address of a second cycle and respective signals.

FIG. 18 is a timing chart showing the relationship between a signal φ L to fetch the column address in the second cycle and signals $\overline{RAS}$, $\overline{CAS}$, φ A, N1, N2, N3, and N4.

Figure 19:
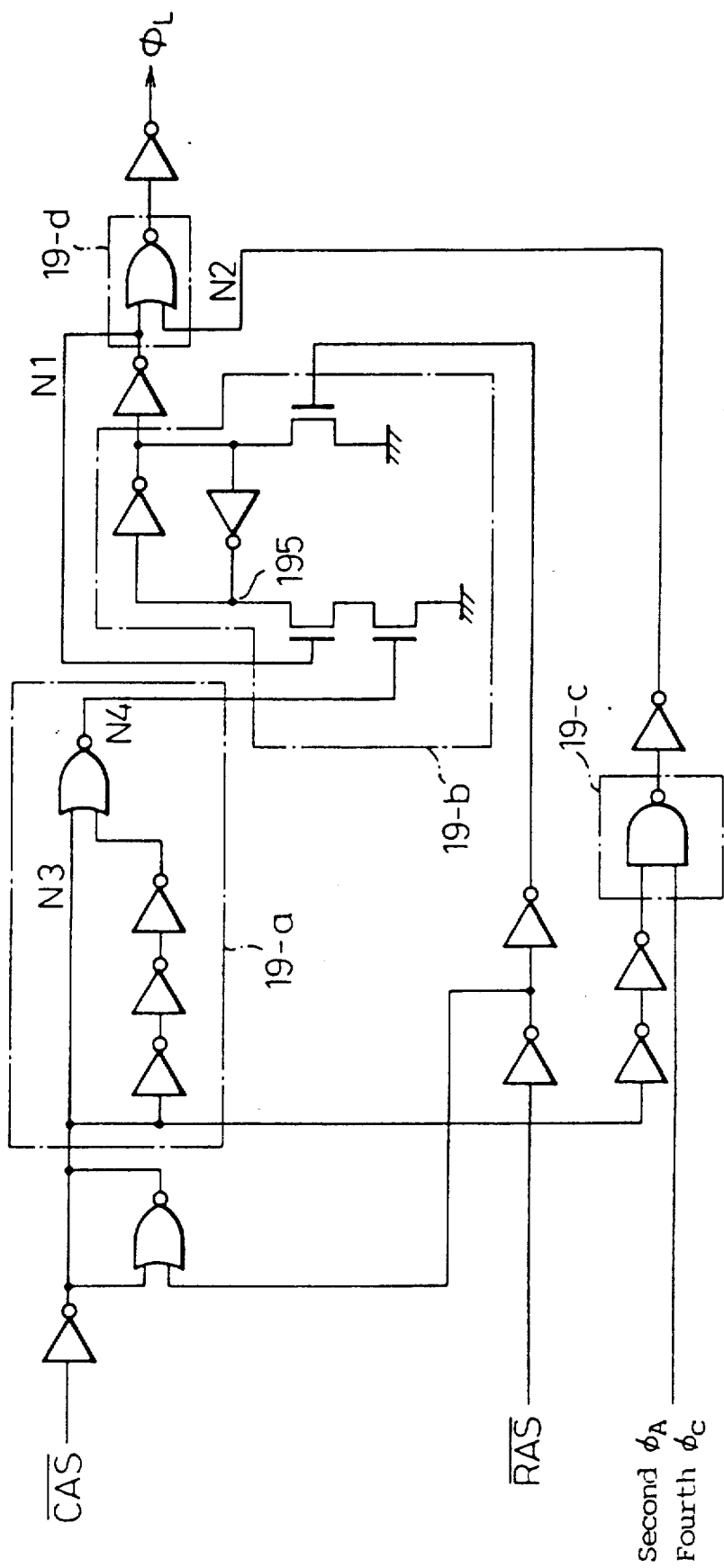
FIG. 19 is a specific electric circuit diagram showing an address fetch circuit 21 (FIG. 2)

FIG. 19 is a specific circuit diagram of the address fetching circuit 21 (see FIG. 2). In the figure, indicated at 19-a is a circuit for generating a pulse having a specified duration upon the first fall edge of the signal $\overline{CAS}$, and at 19-b a circuit which is reset when the signal $\overline{RAS}$ is in the H-level (when a node 195 is in the H-level) and keeps on storing that the signal $\overline{CAS}$ has fallen to the L-level first while the signal $\overline{RAS}$ is in the L-level. Indicated at 19-c is a circuit for extracting only the signal $\overline{CAS}$ in the H-level coming immediately after the first fall edge of the signal CAS in accordance with the signal $\overline{CAS}$ and the signal φ A output from the nibble decoder. Indicated at 19-d is an OR circuit for taking a logical sum of the output of the circuit 19-b and that of the circuit 19-c to generate a signal φ L.

Figure 20:
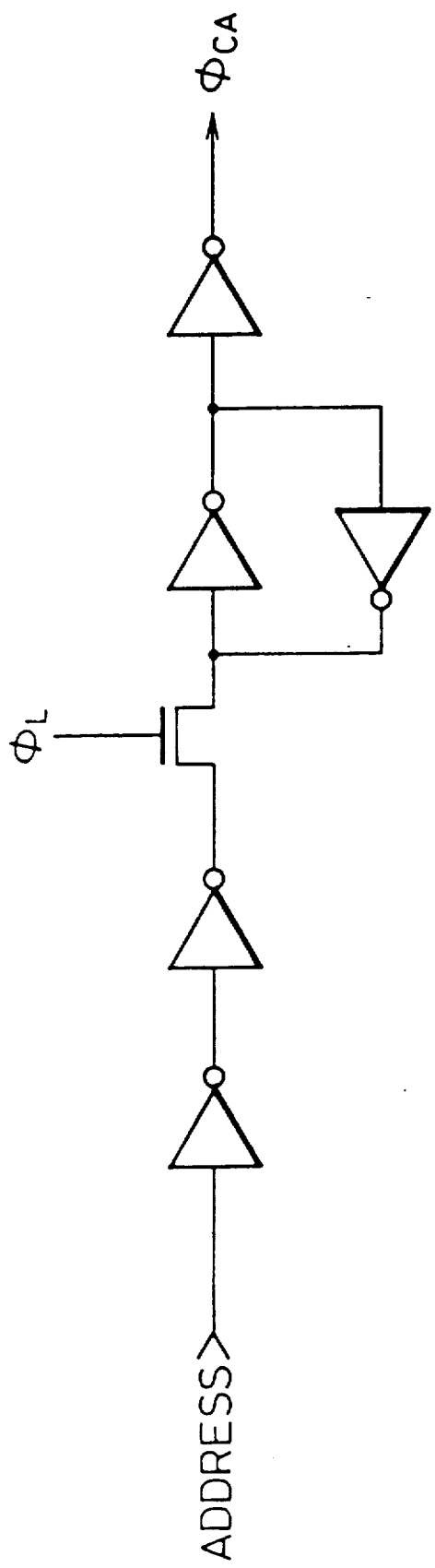
FIG. 20 is an electric circuit diagram showing a specific example of a column address buffer.

FIG. 20 shows a column address buffer circuit.

FIG. 21 shows an exemplary table showing a list of characteristics of the memory device according to the present invention.

Figure 22:
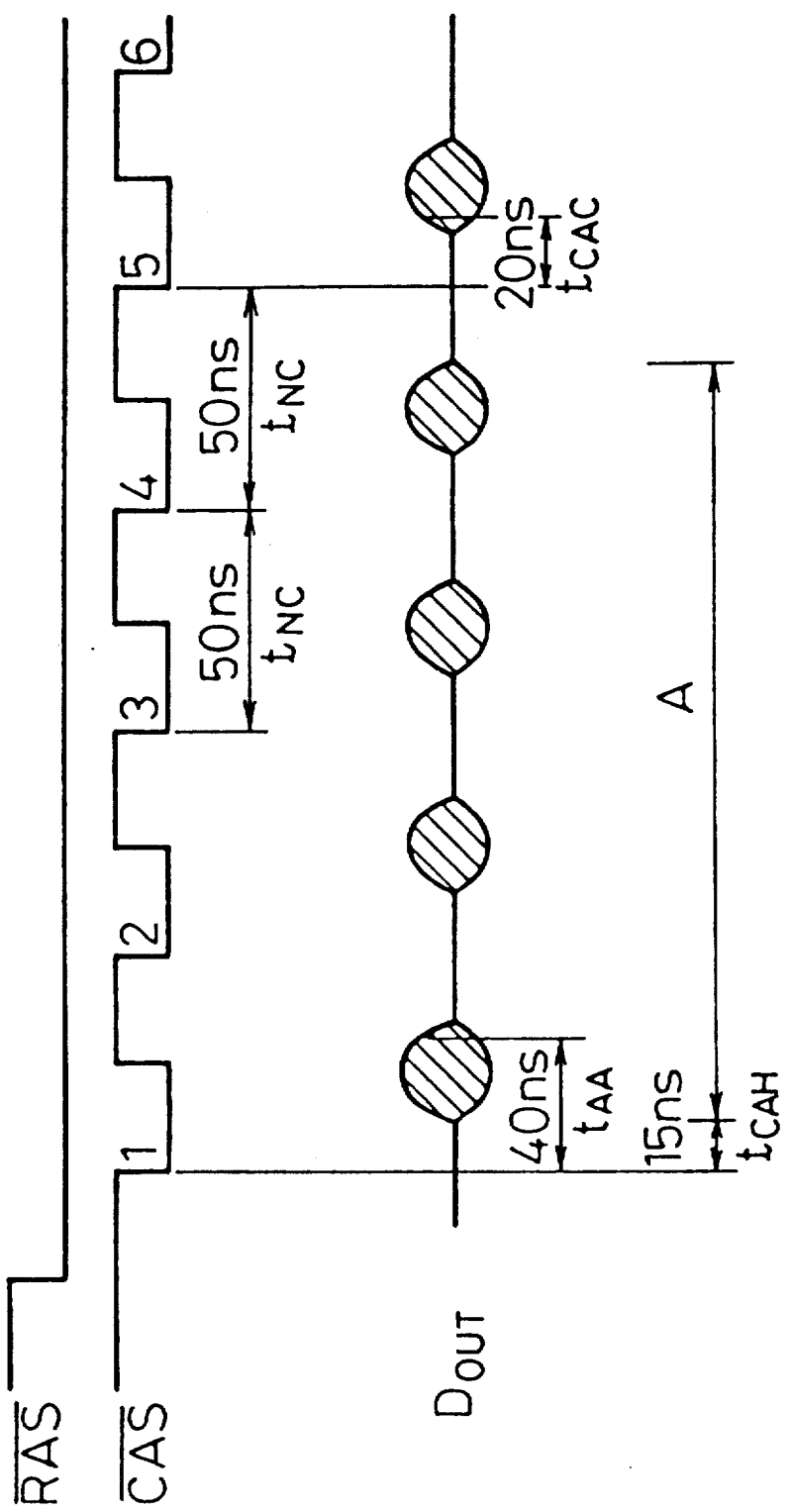
FIG. 22 is a chart showing timings for realizing a normal mode and a nibble mode of the DRAM beyond the scope of specifications.

FIG. 22 is a chart showing timings for realizing a normal mode and a nibble mode of the DRAM beyond the scope of the specifications. Here, it is assumed that a memory used is of the type wherein tRAC=80 ns, tAA=40 ns, and tCAC=20 ns.

Here is considered a fetching time of the column address. A nibble mode of read/write cycle tNC is set at 50 ns for the fall of the row address strobe signal $\overline{RAS}$ and a waveform of the column address strobe signal $\overline{CAS}$.

It is sufficient for the second column address (access time tAA) to satisfy the condition of outputting the data at a fifth fall edge of the signal $\overline{CAS}$. Accordingly, it can be guaranteed to output the data in tCAC (20 ns) if the second column address is fetched more than tAA before the fifth output. In other words, it is sufficient for the second column address to be fetched in a region A shown in FIG. 22. In this case, since the signal $\overline{CAS}$ serves as a fetch clock, the second column address may be fetched at the second, third, or fourth fall edge of the signal CAS.

Figure 6:
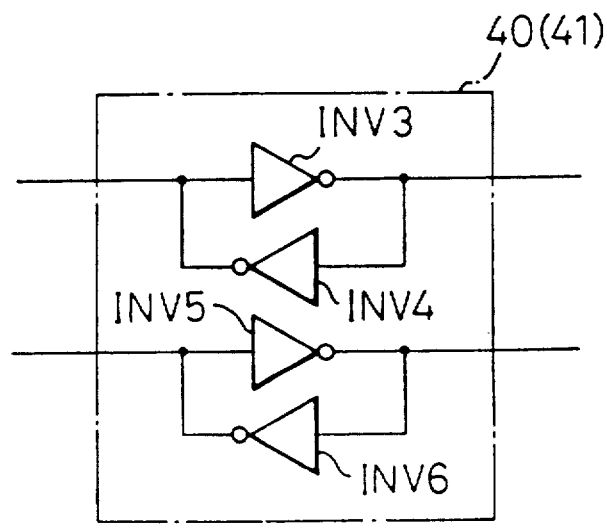
FIG. 6 is an electric circuit diagram showing a latch circuit.
Figure 23:
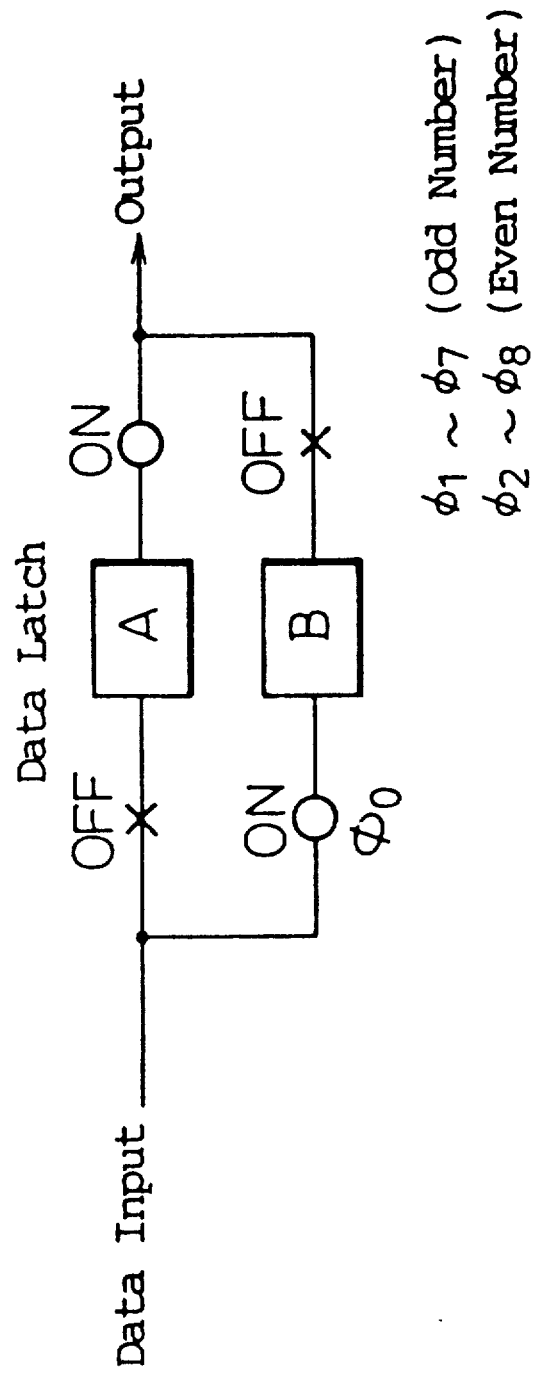
FIG. 23 is a diagram explaining an operation of an output latch circuit including a selector.

An output latch circuit including a selector operates as shown in FIGS. 6 and 23. More specifically, a signal φ 0 to switch an input to the output data latch circuit operates, while one latch is outputting, to feed the input to the other latch.

Figure 24:
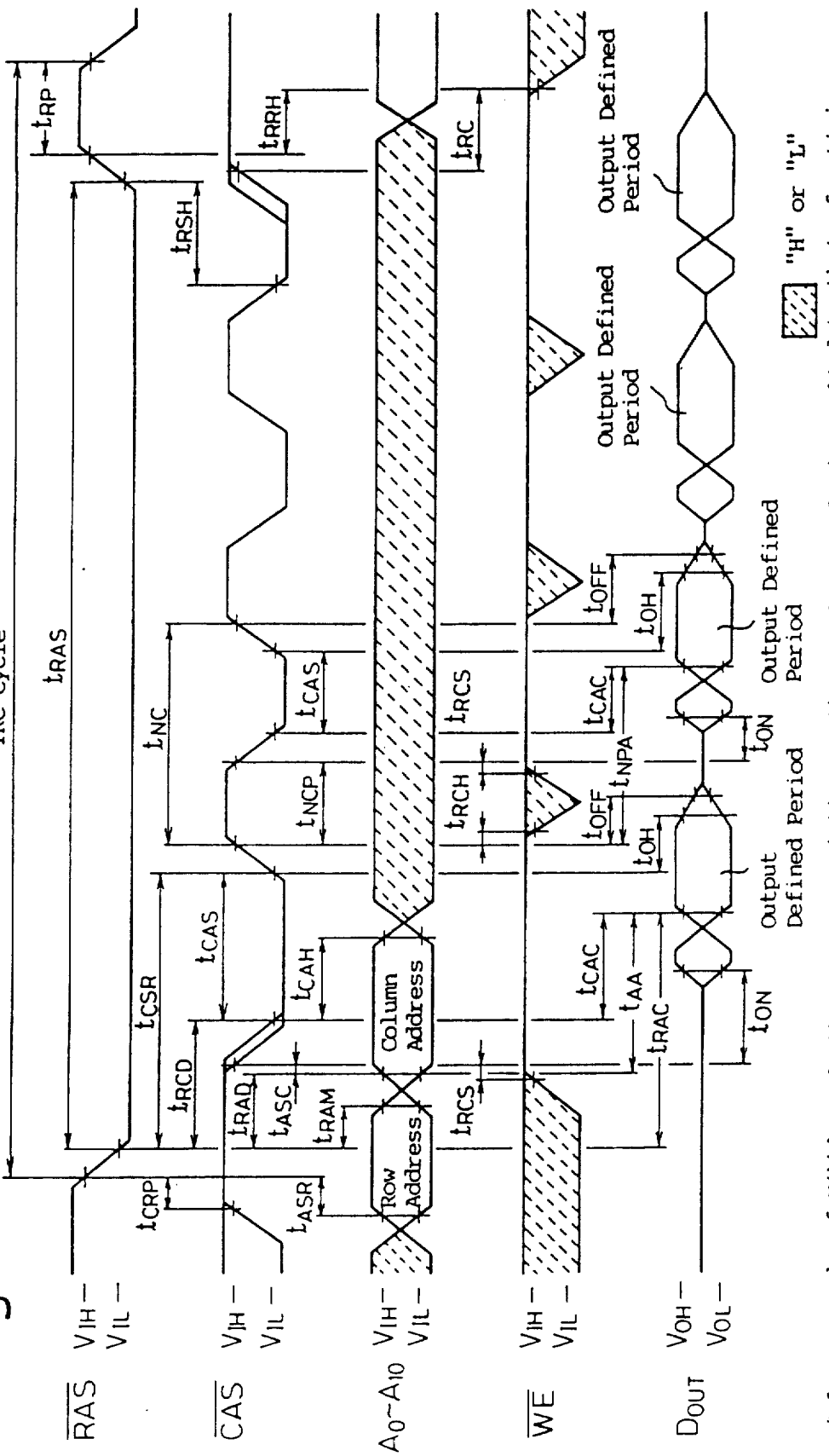
FIG. 24 is a timing chart showing an example of a read cycle in the nibble mode.

FIG. 24 is an exemplary timing chart of a read cycle in the nibble mode.

Figure 3:
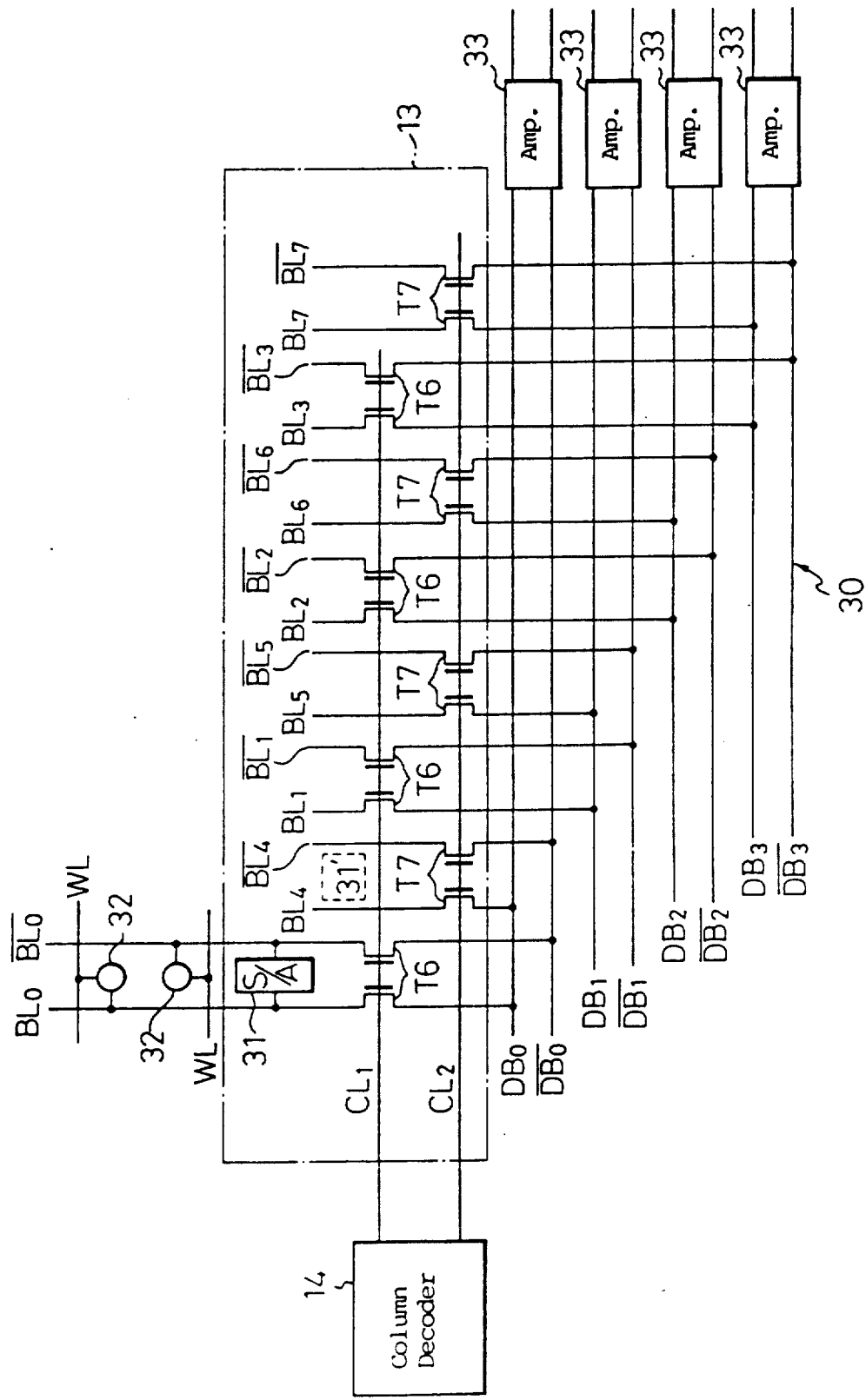
FIG. 3 is an electric circuit diagram showing a data bus in the first embodiment.

As shown in FIG. 3, a data bus 30 in this embodiment includes four pairs of data bus lines DB0, $\overline{DB0}$ to DB3, $\overline{DB3}$, to which are connected eight pairs of bit lines. Specifically, two pairs of bit lines BL0, $\overline{BL0}$; and BL4, $\overline{BL4}$ are connected to the pair of bus lines DB0, $\overline{DB0}$. Two pairs of bit lines BL1, $\overline{BL1}$; and BL5, $\overline{BL5}$ are connected to the pair of bus lines DB1, $\overline{DB1}$. Two pairs of bit lines BL2, $\overline{BL2}$; and BL6, $\overline{BL6}$ are connected to the pair of bus lines DB2, $\overline{DB2}$. Two pairs of bit lines BL3, $\overline{BL3}$; and BL7, $\overline{BL7}$ are connected to the pair of bus lines DB3, $\overline{DB3}$.

The respective pairs of bit lines BL0, $\overline{BL0}$ to BL3, $\overline{BL3}$ are connected to a memory cell 32 having one end thereof connected to a word line WL through gate transistors T6 serving as a first selector circuit 6 and a sense amplifier 31. Likewise, the respective pairs of bit lines BL4, $\overline{BL4}$ to BL7, $\overline{BL7}$ are connected through gate transistors T7 serving as a first selector circuit 6 and a sense amplifier (31' (hereinafter unillustrated)) to a memory cell having one end thereof connected to a word line. A column selection signal CL1 is input to gate terminals of the respective gate transistors T6, while a column selection signal CL2 is input to gate terminals of the respective gate transistors T7. Accordingly, when the column selection signal CL1 becomes a logic "1" in a state where the specified word line WL is selected in the read cycle, the respective pairs of bit lines BL0, $\overline{BL0}$ to BL3, $\overline{BL3}$ are connected to the respective pairs of data buses DB0, $\overline{DB0}$ to DB3, $\overline{DB3}$. On the other hand, when the column selection signal CL2 becomes a logic "1", the respective pairs of bit lines BL4, $\overline{BL4}$ to BL7, $\overline{BL7}$ are connected to the respective pairs of data buses DB0, $\overline{DB0}$ to DB3, $\overline{DB3}$.

Figure 4:
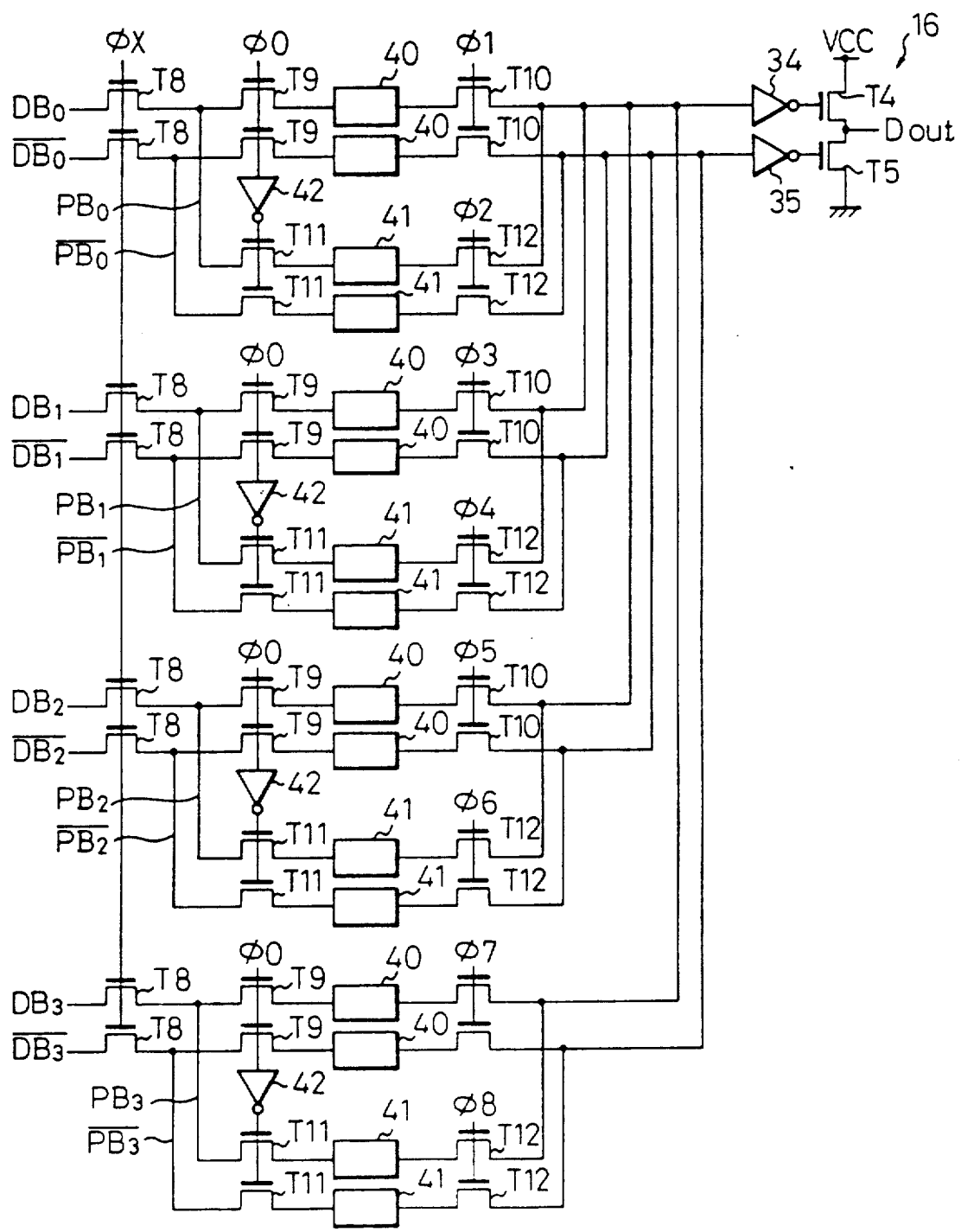
FIG. 4 is an electric circuit diagram showing a data latch unit of the first embodiment.
Figure 5:
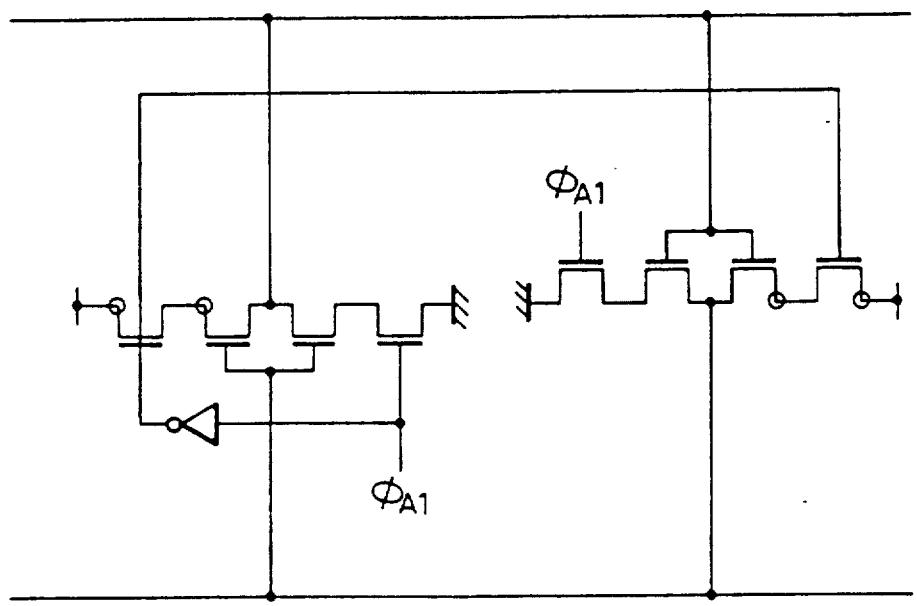
FIG. 5 is an electric circuit diagram showing an amplifier.

The pairs of data bus lines DB0, $\overline{DB0}$ to DB3, $\overline{DB3}$ are each provided with an amplifier 33. Each amplifier 33 includes inverter circuits INV1 and INV2 as shown in FIG. 5. As shown in FIG. 4, in the pairs of data bus lines DB0, $\overline{DB0}$ to DB3, $\overline{DB3}$, gate transistors T8 are connected to output sides of the respective amplifiers 33. The gate transistors T8 are adapted to input control signals φ X to gate terminals of the amplifiers 33. Thus, the data bus 30 is disconnected immediately after the amplifiers 33 when the control signal φ X is a logic "0", whereare the amplifiers 33 transfer data to the data bus 30 when the control signal φ X is a logic "1". Pairs of branch bus lines PB0, $\overline{PB0}$ to PB3, $\overline{PB3}$ are branched from the pairs of data bus lines DB0, $\overline{DB0}$ to DB3, $\overline{DB3}$ after the respective gate transistors T8. These pairs of branch bus lines PB0, $\overline{PB0}$ to PB3, $\overline{PB3}$ constitute a branch bus.

A gate transistor T9, a latch circuit 40, and a gate transistor T10 are provided in series on each of the data bus lines DB0, $\overline{DB0}$ to DB3, $\overline{DB3}$. Further, a gate transistor T11, a latch circuit 41, and a gate transistor T12 are provided in series on each of the branch bus lines PB0 to $\overline{PB3}$. The latch circuits 40, 41 are each a known latch circuit including four inverters INV3 to INV6, and adapted to latch the data read out through the data bus lines DB0 to $\overline{DB3}$ by the gate transistor T9 or T11.

In this embodiment, the gate transistors T9 and T11 constitute a second selector circuit 7. The control signal φ 0 is input to gate terminals of the gate transistors T9, while an inverted signal of the control signal φ 0 is input to gate terminals of the gate transistors T11. Accordingly, only the gate transistors T9 turn ON in the case where the control signal φ 0 is a logic "1", and therefore the data are latched by the respective latch circuits 40 provided on the data bus lines DB0, $\overline{DB0}$ to DB3, $\overline{DB3}$. Only the gate transistors T11 turn ON in the case where the control signal φ 0 is a logic "0", and therefore the data are latched by the respective latch circuits 41 provided on the pair of the branch bus lines PB0, $\overline{PB0}$ to PB3, $\overline{PB3}$.

The gate transistors T10, T12 constitute a third selector circuit 8. A control signal φ 1 is input to gate terminal of the gate transistors T10 provided on the pair of data bus lines DB0, $\overline{DB0}$ a control signal φ 3 is input to gate terminals of the gate transistors T10 provided on the pair of data bus lines DB1, $\overline{DB1}$; a control signal φ

5 is input to gate terminals of the gate transistors T10 provided on the pair of data bus lines DB2, $\overline{DB2}$; and a control signal $\phi$ 7 is input to gate terminals of the gate transistors T10 provided on the pair of data bus lines DB3, $\overline{DB3}$. Further, a control signal $\phi$ 2 is input to gate terminals of the gate transistors T12 provided on the pair of branch bus lines PB0, $\overline{PB0}$; a control signal $\phi$ 4 is input to gate terminals of the gate transistors T12 provided on the pair of branch bus lines PB1, $\overline{PB1}$; a control signal $\phi$ 6 is input to gate terminals of the gate transistors T12 provided on the pair of branch bus lines PB2, $\overline{PB2}$; and a control signal $\phi$ 8 is input to gate terminals of the gate transistors T12 provided on the pair of branch bus lines PB3, $\overline{PB3}$.

The data bus lines DB0 to DB3 and the branch bus lines PB0 to PB3 are connected to a common inverter circuit 34 after the gate transistors T10, T12 thereof. On the other hand, the data bus lines $\overline{DB0}$ to $\overline{DB3}$ and the branch bus lines $\overline{PB0}$ to $\overline{PB3}$ are connected to a common inverter circuit 35 after the gate transistors T10, T12 thereof.

Figure 7A:
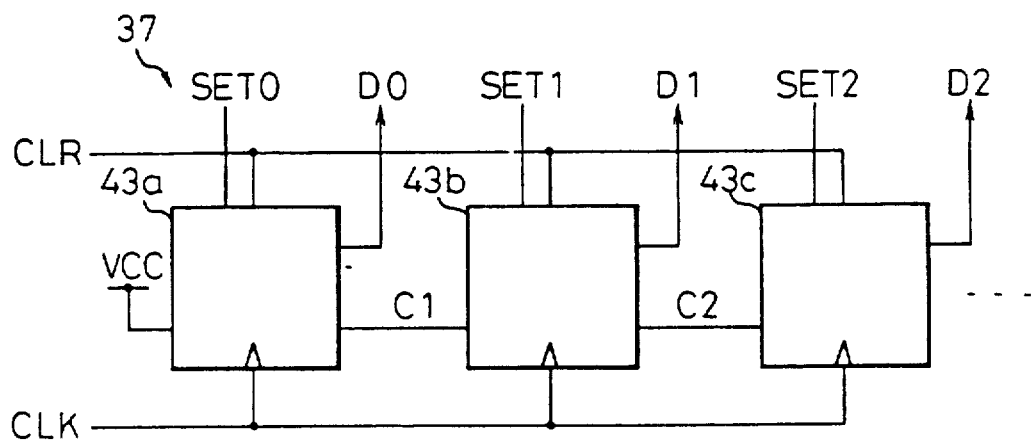
FIG. 7(A) and 7(B) is a block diagram showing a nibble counter.
Figure 7B:
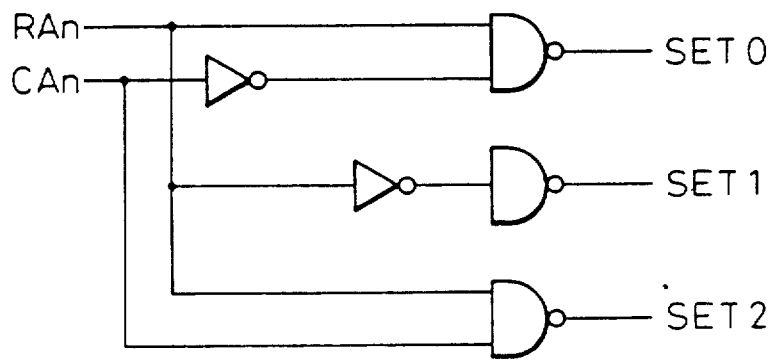
Figure 8:
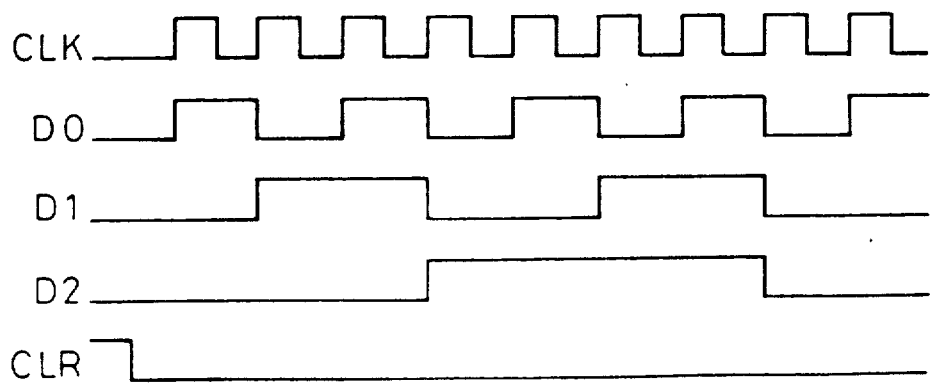
FIG. 8 is a timing chart showing an operation of the nibble counter.

As shown in FIG. 7, the nibble counter 37 includes three master/slave type flip-flops (hereinafter abbreviated as FF) 43a to 43c. As seen in FIG. 8, the FF 43a inverts a bit D0 upon receipt of each clock signal CLK input from the clock generating circuit 22; the FF 43b inverts a bit D1 upon receipt of every two clock signals CLK; and the FF 43c inverts a bit D2 upon receipt of every four clock signals CLK. The FFs 43a to 43c output the bits D0 to D2 to the nibble decoder 38.

Figure 9:
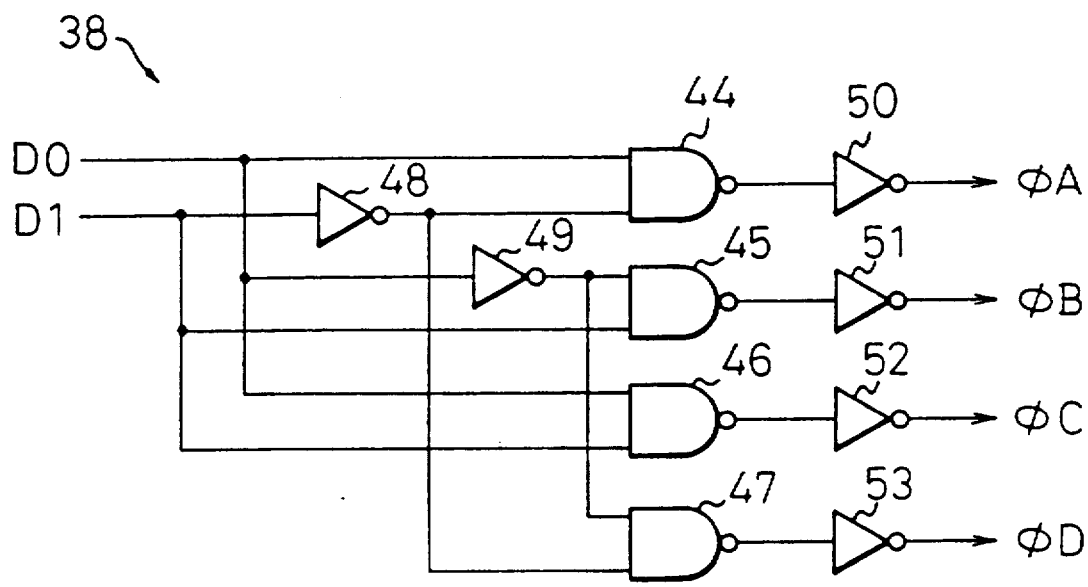
FIG. 9 is a logic circuit diagram showing a nibble decoder.
Figure 12:
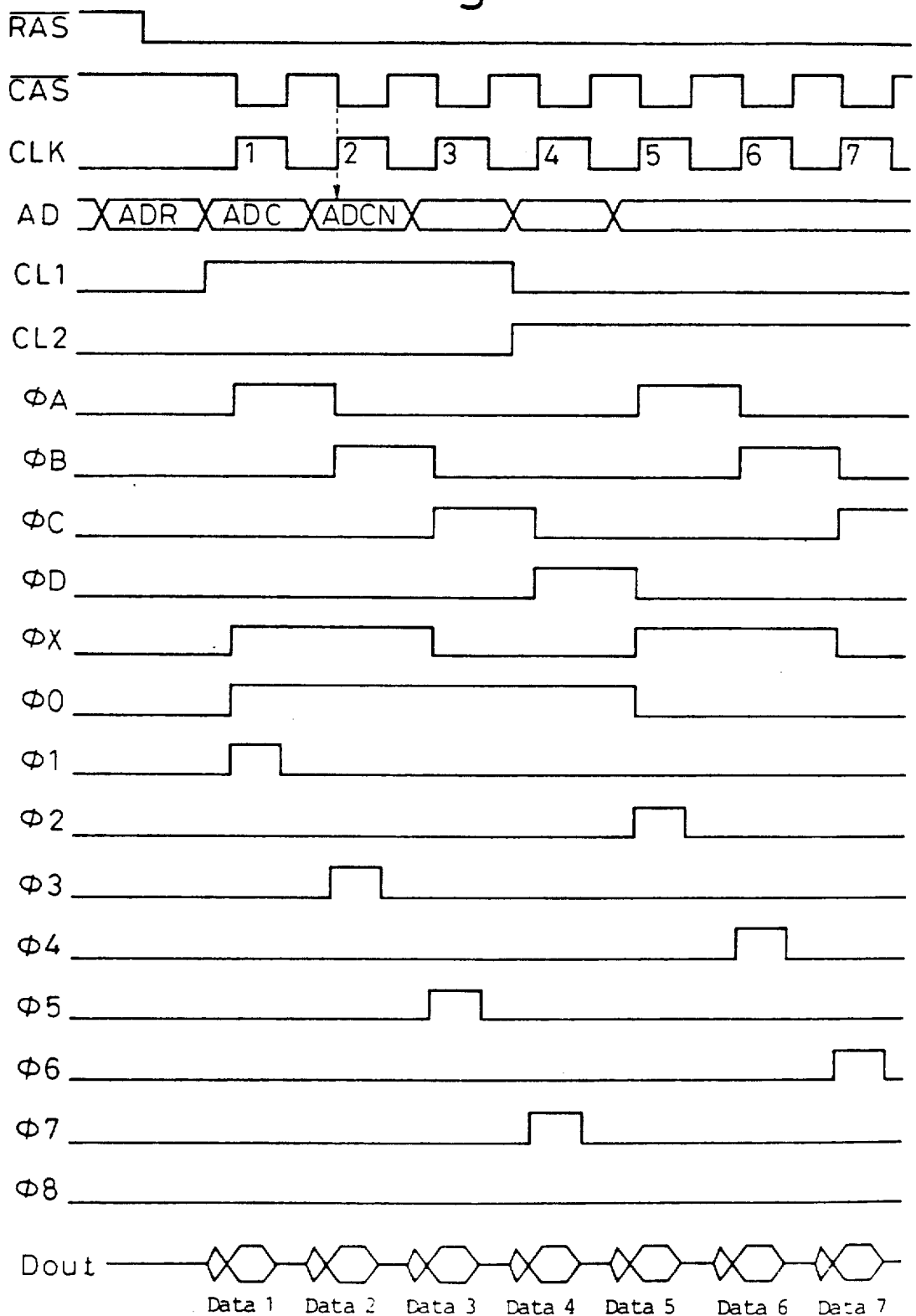
FIG. 12 is a timing chart showing an operation of the first embodiment.

The nibble decoder 38 includes NAND circuits 44 to 47 and inverter circuits 48 to 53 as shown in FIG. 9, and is adapted to decode the bits D0, D1 from the nibble counter 37 and to output control signals $\phi$ A to $\phi$ D shown in FIG. 12 to the gate control circuit 39. More specifically, the NAND circuit 44 receives the bits D0 and $\overline{D1}$, and outputs the control signal $\phi$ A through the inverter circuit 50. The NAND circuit 45 receives the bits D0 and $\overline{D1}$, and outputs the control signal $\phi$ B through the inverter circuit 51. The NAND circuit 46 receives the bits D0 and D1, and outputs the control signal $\phi$ C through the inverter circuit 52. The NAND circuit 47 receives the bits $\overline{D0}$ and $\overline{D1}$, and outputs the control signal $\phi$ D through the inverter circuit 53.

Figure 10:
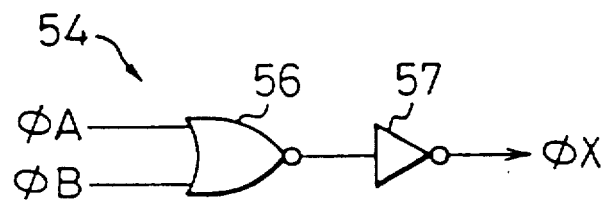
FIG. 10 is a logic circuit diagram showing a first gate controller.
Figure 11:
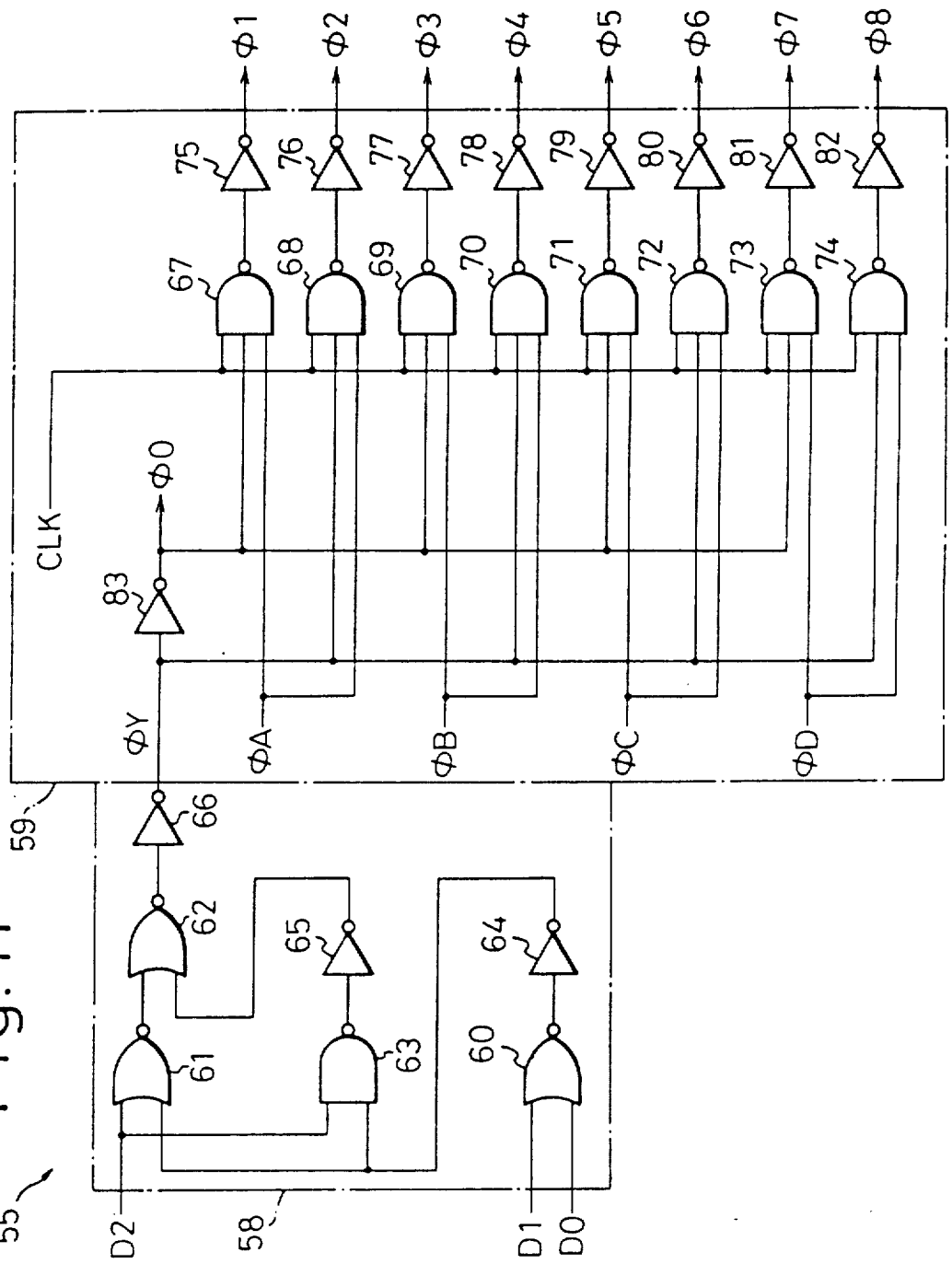
FIG. 11 is a logic circuit diagram showing a second gate controller.

The gate control circuit 39 includes a first gate control unit 54 shown in FIG. 10 and a second gate control unit 55 shown in FIG. 11. The first gate control unit 54 is provided with a NOR circuit 56 to which the control signals $\phi$ A and $\phi$ B are input from the nibble decoder 38, and an inverter circuit 57, and outputs the control signal $\phi$ X shown in FIG. 12 to said respective gate transistors T8 (see FIG. 4) based on the control signals $\phi$ A, $\phi$ B. Accordingly, the control signal $\phi$ X is a logic "1" only during a period when either the control signal $\phi$ A or $\phi$ B is a logic "1", and the gate transistors T8 turn on at this time.

The second gate control unit 55 includes first and second control signal generators 58 and 59 as shown in FIG. 11. The first control signal generator 58 includes NOR 60 to 62, a NAND circuit 63, and inverter circuits 64 to 66, and generates a control signal $\phi$ Y upon receipt of the bits D0 to D2 input from the nibble counter 37. The NOR circuit 60 receives the bits D0 and D1, and has an output terminal thereof connected to the inverter circuit 64. The NOR circuit 61 receives a bit D2 and is connected to the inverter circuit 64. An output terminal of the NOR circuit 61 is connected to the NOR circuit 62. The NAND circuit 63 receives a bit D2 and is connected to the inverter circuit 64. An output terminal of the NAND circuit 63 is connected to the NOR circuit 62 through the inverter circuit 65.

Accordingly, in the case where the bit D2 is a logic "0" and at least one of the bits D0 and D1 is a logic "1", and in the case where the bit D2 is a logic "1" and both the bits D0 and D1 are a logic "0", the control signal $\phi$ Y is a logic "0". Further, in the case where the bit D2 is a logic "1" and at least one of the bits D0 and D1 is a logic "1", and in the case where the bit D2 is a logic "0" and both the bits D0 and D1 are logic "0", the control signal $\phi$ Y is a logic "1".

The second control signal generator 59 includes NAND circuits 67 to 74 and inverter circuits 75 to 83, and outputs control signals $\phi$ 0 to $\phi$ 8 shown in FIG. 12. More specifically, the inverter circuit 83 inverts said control signal $\phi$ Y, and outputs the control signal $\phi$ 0 to control said gate transistors T9 and T11. The NAND circuit 67 receives the clock signal CLK and the control signals $\phi$ 0 and $\phi$ A, and outputs the control signal $\phi$ through the inverter circuit 15. The NAND circuit 69 receives the clock signal CLK and the control signals $\phi$ 0 and $\phi$B, and outputs the control signal $\phi$ 3 through the inverter circuit 77. The NAND circuit 71 receives a clock signal CLK and the control signals $\phi$ 0 and $\phi$ C, and outputs the control signal $\phi$ 5 through the inverter circuit 79. The NAND circuit 73 receives the clock signal CLK and the control signals $\phi$ 0, $\phi$ D, and outputs the control signal $\phi$ 7 through the inverter circuit 81.

The NAND circuit 68 receives the clock signal CLK and the control signals $\phi$ Y, $\phi$ A, and outputs the control signal $\phi$ 2 through the inverter circuit 76. The NAND circuit 70 receives the clock signal CLK and the control signals $\phi$ Y and $\phi$ B, and outputs the control signal $\phi$ 4 through the inverter circuit 78. The NAND circuit 72 receives the clock signal CLK and the control signals $\phi$ Y and $\phi$ C, and outputs the control signal $\phi$ 6 through the inverter circuit 80. The NAND circuit 74 receives the clock signal CLK and the control signal $\phi$ 8 through the inverter circuit 82.

An operation of thus constructed DRAM will be described hereinafter with reference to FIGS. 12 and 13.

When the row address strobe signal $\overline{RAS}$ switches to L-level, the read cycle is started if the column address strobe signal $\overline{CAS}$ is in the H-level. After some word line WL is selected by a row address ADR represented by an address signal AD, the column address ADC is fed to switch the column selection signal CL1 to H-level. Thereupon, the data written in the specified memory cells 22 on the pairs of bit lines BL0, $\overline{BL0}$ to BL3 are output to the pairs of data bus lines DB0, $\overline{DB0}$ to DB3, $\overline{DB3}$ through the gate transistors T6, and are amplified by the amplifiers 33.

Next, when a first clock signal CLK is counted by the nibble counter 37, the control signal $\phi$ A becomes a logic "1" and the control signals $\phi$ X and $\phi$ 0 also become logic "1". Thereby, the respective gate transistors T8 and T9 are turned ON, and the data read through the pairs of bit lines BL0, $\overline{BL0}$ to BL3, $\overline{BL3}$ are latched with regard to the latch circuits 40 provided on the pairs of the data bus lines DB0, $\overline{DB0}$ to DB3, $\overline{DB3}$.

Since the control signal $\phi$ A is a logic "1" at this time, the control signal $\phi$ 1 becomes a logic "1". Thereupon, only the gate transistors T10 provided on the pair of data bus lines DB0, $\overline{DB0}$ are tuned on and the data read through the pairs of the data bus lines DB0, $\overline{DB0}$ are output through the data output buffer 16.

Next, when a second clock signal CLK is counted, the control signal φ B becomes a logic "1". Accordingly, the control signal φ 3 becomes a logic "1", and only transistors T10 provided on the pair of data bus lines DB1, $\overline{DB1}$ are turned on. Then, the data read through the pairs of the data bus lines DB1, $\overline{DB1}$ are output through the data output buffer 16. Hereafter, when a third clock signal CLK is counted in the same way, the control signal φ C becomes a logic "1" and the control signal φ 5 becomes a logic 1, and the data read through the pair of data bus lines DB2, $\overline{DB2}$ are output through the data output buffer 16.

Figure 13:
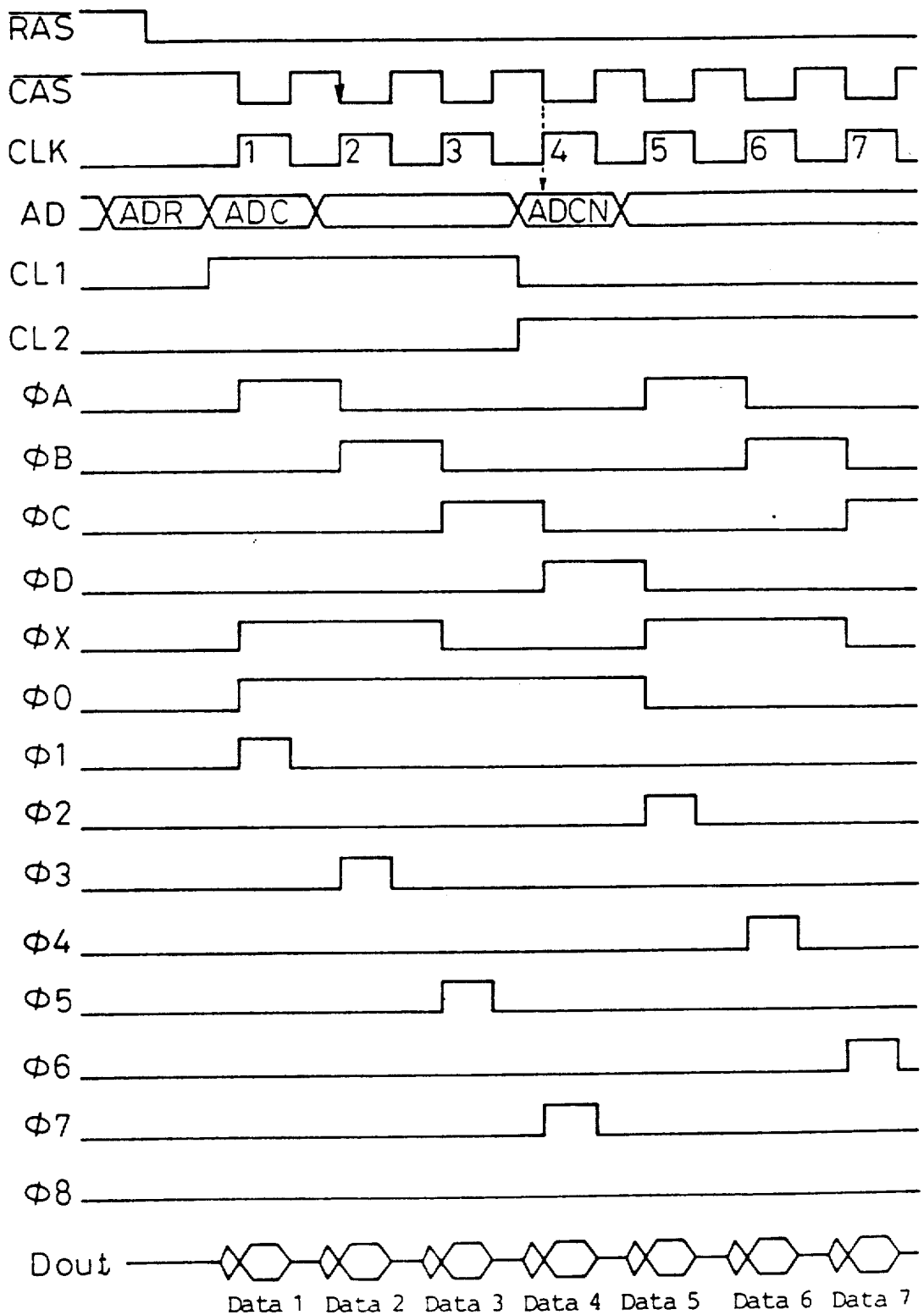
FIG. 13 is a timing chart showing an operation of a second embodiment.

If a next column address ADCN is fed before a fourth clock signal CLK is counted as shown in FIG. 13, the column selection signal CL2 switches to H-level while the column selection signal CL1 switches to L-level. Thereupon, the data written in the specified memory cells 22 on the pairs of bit lines BL4, $\overline{BL4}$ to BL7, $\overline{BL7}$ are output to the pairs of data bus lines DB0, $\overline{DB0}$ to DB3, $\overline{DB3}$ through the gate transistors T7, and are amplified by the amplifiers 33. Since the control signal φ X is a logic "0" at this time, the respective gate transistors T8 are turned off. Thus, the data in the amplifiers 33 are not transferred.

Subsequently, when a fourth clock signal CLK is counted, the control signal φ D becomes a logic "1" and the control signal φ 7 becomes a logic "1". Thus, the data read through the pair of data bus lines DB3 and $\overline{DB3}$ are output through the data output buffer 16.

Then, when a fifth clock signal CLK is counted, the control signal φ A becomes a logic "1", the control signal φ X becomes a logic "1", and the control signal φ 0 becomes a logic "0". Thereby, the respective gate transistors T8 and T11 are turned on, and the data read through the pairs of bit lines BL4, BL4 to BL7, BL7 and amplified by the amplifiers 33 are simultaneously latched by the latch circuits 41 provided on the pairs of the branched bus lines PB0, $\overline{PB0}$ to PB3, $\overline{PB3}$.

Since the control signal φ A is a logic "1" at this time, the control signal φ 2 becomes a logic "1". Thereupon, only the gate transistors T12 provided on the pair of branched bus lines PB0 and $\overline{PB0}$ are turned on and the data read through the branched bus lines PB0 and $\overline{PB0}$ are output through the data output buffer 16.

Then, when a sixth clock signal CLK is counted, the control signal φ B becomes a logic "1" and since the control signal φ 0 becomes logic "0", the control signal φ 4 becomes a logic "1", and the data read through the pairs of branched bus lines PB1 and $\overline{PB1}$ are output through the data output buffer 16.

Hereafter, when seventh and eighth clock signals CLK are counted in the same way, the control signals φ C and φ D become logic "1" sequentially, and both data read through the pair of branch bus lines PB2, $\overline{PB2}$ and through the pair of branched bus lines PB3, $\overline{PB3}$ are output sequentially.

As set forth above, in this embodiment, a branched bus line is provided for a data bus including a plurality of pairs of data bus lines DB0, $\overline{DB0}$ to DB3, $\overline{DB3}$. In addition, latch circuits 40, 41 are arranged on the pair of the bus lines DB0, $\overline{DB0}$ to DB3, $\overline{DB3}$ and the pairs of branched bus lines PB0, $\overline{PB0}$ to PB3, $\overline{PB3}$. In one read cycle, first, data to be output next are read up to immediately before the latch circuits 41 arranged on the pairs of the branched bus lines by switching a column address while data are first latched to the latch circuits 40 on the pairs of bus lines and are output in synchronization with a clock signal. At the same time when the last data in the latch circuits 40 on the pairs of bus lines is output, the read data that was read in the latch circuits 41 arranged on the pairs of the branched bus lines is latched, and is sequentially output in synchronization with the clock signal. Accordingly, different data can be sequentially output in one read cycle, and a data reading speed can be increased.

In the embodiment shown in FIG. 3, the invention is embodied by a DRAM in which a single data output buffer 16 is provided for a data bus 30 including pairs of data bus lines DB0, DB0 to DB3, DB3. However, the invention may be embodied by a DRAM comprising a plurality of data buses each including a plurality of pairs of bus lines and a respective data output buffer provided for each data bus.

Industrial Utilization Possibility of the Invention

As described above, the invention has an excellent advantage of reading different data sequentially by changing an initial address in the same read cycle, and of increasing a data reading speed in a dynamic RAM of the nibble mode type.

I claim:

1. A semiconductor memory device which fetches a row address in response to a row address strobe signal, fetches a column address in response to a first column address strobe signal, accesses a memory cell consisting essentially of a specified number of bits in response to a toggle of said column address strobe signal, and output the data read from said memory cell sequentially in a serial form, said device comprising:
   means for fetching a column address adapted to access a following memory cell during an activating period of said row address strobe signal after said column address is fetched, said column address for accessing the following memory cell being fetched in response to said toggled column address strobe signal;
   a plurality of data buses for receiving a plurality of bits of parallel data output from a memory cell array;
   first and second latch circuit groups either of which is alternately selected by a first selector circuit upon receipt of a first control signal, and each of which includes a plurality of bits of latch circuits;
   a second selector circuit for, upon receipt of a second control signal, sequentially selecting the plurality of latch circuits among either one of said first and said second latch circuit groups to output the data latched by the selected latch circuits; and
   means for generating said first control signal in response to activation of the column address strobe signal when said column address is fetched and for generating said second control signal in response to the toggle of said column address strobe signal.

2. A semiconductor memory device comprising:
   a data bus (1) including a plurality of pairs of bus lines (DB0, DB0, DB1, DB1);
   a first latch circuit group (3A to 3D) including a plurality of latch circuits arranged on the respective pairs of bus lines (DB0, DB0, DB1, DB1) of said data bus (1);
   a second latch circuit group (4A to 4D) including a plurality of latch circuits arranged on respective pairs of bus lines (PB0, PB0, PB1, PB1) of the data bus (2), and provided in parallel with said first latch circuit group;

a memory cell array (5) which is connected to a first selector circuit (6) and is adapted to output a plurality of bits of data in in response to correspondence with the respective pairs of bus lines (DB0, DB0, DB1, DB1) of the data bus (1);

a second selector circuit (7) for selecting either one of said first or said second latch circuit groups in response to a first control signal ($\phi 0, \phi X$);

a third selector circuit (8) for outputting data selected from the latch circuits of the either one of said first and said second latch circuits groups in response to a second control signal ($\phi 1$ to $\phi 8$);

an output circuit (9) for receiving data latched by one latch circuit and output from the third selector circuit (8) to output an output signal;

a row address buffer (17) for fetching a row address in response to activation of a row address strobe signal;

an address fetching circuit (21) which is responsive to activation of an initial column address strobe signal during an activating period of a row address strobe signal and is adapted to output a third control signal instructing to fetch a column address each time a toggled column address strobe signal is activated a predetermined number of times;

a column address buffer (19) or fetching the column address in response to the third control signal output from said address fetching circuit; and a circuit means (38, 39) for generating said second control signal in response to a toggle of said column address strobe signal and generating the first control signal each time said column address strobe signal is activated the predetermined number of times.

* * * * *

UNITED STATES PATENT AND TRADEMARK OFFICE
CERTIFICATE OF CORRECTION

PATENT NO. : 5,323,355
DATED : June 21, 1994
INVENTOR(S) : Yoshiharu Kato

It is certified that error appears in the above-indentified patent and that said Letters Patent is hereby corrected as shown below:

Drawing Figure 1, Sheet 1 of 21 and on Title Page, in lower left hand corner of Figure, delete "Nible Decoder" and substitute --Nibble Decoder--.

Col. 1, line 7, after "particularly" insert a --,--; and line 17, delete "type" and substitute --types--.

Col. 9, line 39, delete "D0 and $\overline{D1}$" and substitute --$\overline{D0}$ and D1--; and line 60, after "NOR" insert --circuits--.

Col. 10, line 53, after "BL3" insert --, BL3--.

Col. 11, line 6, after "only" insert --the gate--.

Col. 12, line 13, delete "DB0, DB0 to DB3, DB3" and substitute --DB0, $\overline{DB0}$ to DB3, $\overline{DB3}$--;

UNITED STATES PATENT AND TRADEMARK OFFICE
CERTIFICATE OF CORRECTION

PATENT NO. : 5,323,355  
DATED : June 21, 1994  
INVENTOR(S) : Yoshiharu Kato

Page 2 of 3

It is certified that error appears in the above-indentified patent and that said Letters Patent is hereby corrected as shown below:

line 32, delete "output" and substitute --outputs--;

line 61, delete "DB0, DB0, DB1, DB1" and substitute --DB0, $\overline{DB0}$, DB1, $\overline{DB1}$--;

line 64, delete "DB0, DB0, DB1, DB1" and substitute --DB0, $\overline{DB0}$, DB1, $\overline{DB1}$--; and line 68, delete "PB0, PB0, PB1, PB1" and substitute --PB0, $\overline{PB0}$, PB1, $\overline{PB1}$--.

Col. 13, line 5, delete second occurrence of "in";

line 7, delete "DB0, DB0, DB1, DB1" and substitute --DB0, $\overline{DB0}$, DB1, $\overline{DB1}$--;

line 9, both occurrences, delete "said" and substitute --the--;

UNITED STATES PATENT AND TRADEMARK OFFICE
CERTIFICATE OF CORRECTION

PATENT NO. : 5,323,355
DATED : June 21, 1994
INVENTOR(S) : Yoshiharu Kato

Page 3 of 3

It is certified that error appears in the above-indentified patent and that said Letters Patent is hereby corrected as shown below:

line 13, delete "said"; and line 16, delete "and".

Col. 14, line 1, delete "fetching a" and substitute --fetching an external--;

line 8, delete "instructing to fetch a" and substitute --used to instruct fetching of an external--;

line 11, delete "or fetching the" and substitute --for fetching the external--;

line 17, delete "each time said" and substitute --whenever the--; and line 18, delete "the".

Signed and Sealed this

Twenty-first Day of February, 1995

BRUCE LEHMAN

Attest:

Attesting Officer

Commissioner of Patents and Trademarks

UNITED STATES PATENT AND TRADEMARK OFFICE
CERTIFICATE OF CORRECTION

PATENT NO. : 5,323,355
DATED : June 21, 1994
INVENTOR(S) : Yoshiharu Kato

It is certified that error appears in the above-indentified patent and that said Letters Patent is hereby corrected as shown below:

Title page [73] Assignee, after "Fujitsu Limited, Kawasaki, Japan" insert --Fujitsu VLSI Limited, Kasugai, Japan--

Signed and Sealed this

Sixteenth Day of May, 1995

*Attest:*

BRUCE LEHMAN

*Attesting Officer*  *Commissioner of Patents and Trademarks*